US008676058B2

(12) United States Patent
Kagaya

(10) Patent No.: US 8,676,058 B2
(45) Date of Patent: Mar. 18, 2014

(54) DIFFERENTIAL TRANSMISSION CIRCUIT AND INFORMATION PROCESSING SYSTEM

(75) Inventor: Osamu Kagaya, Setagaya-ku (JP)

(73) Assignee: Oclaro Japan, Inc., Kanagawa (JP)

( * ) Notice: Subject to any disclaimer, the term of this patent is extended or adjusted under 35 U.S.C. 154(b) by 131 days.

(21) Appl. No.: 13/450,516

(22) Filed: Apr. 19, 2012

(65) Prior Publication Data

US 2012/0269522 A1 Oct. 25, 2012

(30) Foreign Application Priority Data

Apr. 22, 2011 (JP) ................................. 2011-096377

(51) Int. Cl.
*H04B 10/00* (2013.01)
*H05K 7/00* (2006.01)
*H01P 3/08* (2006.01)
*H04B 10/80* (2013.01)

(52) U.S. Cl.
CPC .................... *H04B 10/801* (2013.01)
USPC ............................ 398/164; 333/238; 361/777

(58) Field of Classification Search
USPC ..................... 398/164, 183; 361/777; 333/238
See application file for complete search history.

(56) References Cited

U.S. PATENT DOCUMENTS

| 7,190,188 | B2* | 3/2007 | Otsuka et al. .................... 326/30 |
| 8,218,973 | B2* | 7/2012 | Kagaya et al. ................ 398/182 |
| 2010/0158530 | A1* | 6/2010 | Soto et al. ........................ 398/79 |

FOREIGN PATENT DOCUMENTS

| JP | 2006-332302 A | 12/2006 |
| JP | 2010-041228 A | 2/2010 |

OTHER PUBLICATIONS

Murata Manufacturing Co., Ltd.; "Chip Common Mode Choke Coils Supporting USB3.0 SuperSpeed Signals"; www.murata.co.jp/new/news_release/2010/0625/index.html; 2010.

* cited by examiner

*Primary Examiner* — Dalzid Singh
(74) *Attorney, Agent, or Firm* — Mattingly & Malur, PC

(57) ABSTRACT

A differential transmission circuit includes a grounded conductive layer, a pair of transmission line conductors, a conductive film and a via hole which connects the grounded conductive layer to the conductive film. The differential transmission circuit further includes a straight-line region which is present in the differential transmission circuit through which a differential transmission signal output by a driving circuit is transmitted and in which the pair of transmission line conductors extends parallel so as to have a first width, and a band rejection filter region in which the pair of transmission line conductors planarly overlaps the conductive film and extends parallel so as to have a second width narrower than the first width and a common mode of the differential transmission signal is attenuated at one of the frequencies which are natural number multiples of a frequency corresponding to the predetermined bit rate.

14 Claims, 22 Drawing Sheets

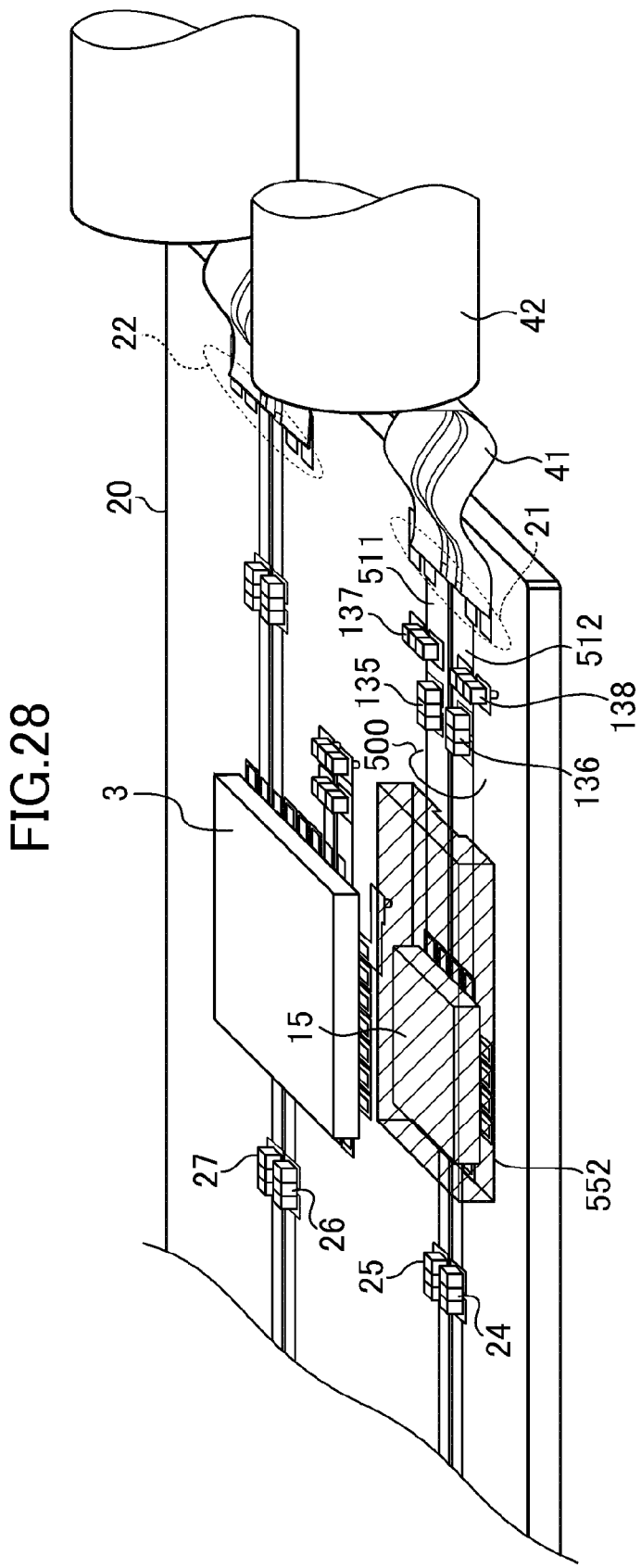

DIFFERENTIAL TRANSMISSION CIRCUIT AND INFORMATION PROCESSING SYSTEM

CROSS-REFERENCE TO RELATED APPLICATION

The present application claims priority from Japanese application JP 2011-096377 filed on Apr. 22, 2011, the content of which is hereby incorporated by reference into this application.

BACKGROUND OF THE INVENTION

1. Field of the Invention

The present invention relates to a differential transmission circuit and an information processing system using the differential transmission circuit, and more particularly, to a technique of suppressing unintentional electromagnetic radiation from the differential transmission circuit.

2. Description of the Related Art

A transmission line is used in high-speed digital transmission of serial data. For example, not single-end transmission but differential transmission is generally used to transmit serial data at a speed of hundreds or more of Mbit/s. A transmission line used for the differential transmission is a differential transmission line. In general, the differential transmission line includes a grounded conductive layer and a pair (two) of transmission line conductors which is formed on one side of the grounded conductive layer via a dielectric layer interposed therebetween and extends in a strip shape.

For example, a driving circuit performing driving at a predetermined bit rate outputs a differential transmission signal to the differential transmission line. Since the ideal differential transmission signal is different from a clock signal and does not include a repeated signal pattern, the ideal differential transmission signal has no large peak intensity on the frequency spectrum. However, in effect, switching noise occurs due to non-linearity of a transistor in the driving circuit. As a result, a large peak is sometimes observed as noise in the frequency corresponding to the bit rate of the serial data at which the driving circuit performs the driving and harmonics of the frequencies, that is, frequencies which are natural number multiples of the frequency corresponding to the bit rate of the serial data at which the driving circuit performs the driving in a frequency spectrum of a common mode signal component of the differential transmission signal output to the differential transmission line. The frequency corresponding to the bit rate of the serial data refers to the frequency of 10 GHz when the serial data is binary modulation serial data of, for example, the bit rate of 10 Gbit/s. A part of the switching noise in these frequencies of the common mode signal component propagates as radiation loss toward to the surroundings during the transmission of the differential transmission signal through the differential transmission line, and thus the unintentional electromagnetic radiation occurs in these frequencies.

In techniques of the related art, propagation of electromagnetic waves to a space is suppressed by covering the differential transmission line and the driving circuit by a metal case and allowing a gap (or a hole) formed in the assembly of the metal case to be very small and the propagation of the electromagnetic waves to a space is further attenuated by disposing an electromagnetic wave absorption material inside the metal case. Further, Patent Document 1 (JP2006-332302A) and Non-Patent Document 1 ("Chip Common Mode Choke Coils Supporting USB 3.0 SuperSpeed Signals", Murata Manufacturing Company, Ltd., "http://www.murata.co.jp/new/news_release/2010/0625/index.html" (searched for on Mar. 31, 2011) disclose techniques of suppressing the propagation of a common mode signal component by inserting a common mode choke coil into the differential transmission line to increase the impedance for the common mode. Further, Patent Document 2 (JP2010-41228A) discloses a technique of suppressing generation of switching noise by innovation of a differential output circuit of a differential amplification IC, suppressing the conduction propagation of the common mode signal component, and thus suppressing the occurrence of the unintentional electromagnetic radiation.

SUMMARY OF THE INVENTION

In recent years, the intensity of allowable unintentional electromagnetic radiation has had to be small and steep with the miniaturization or integration of an apparatus. In the techniques of the related art in which the differential transmission line and the like are covered by the metal case, the differential transmission line and the driving circuit have to be covered by the metal case for which the gap is very small in order to decrease the intensity of the unintentional electromagnetic radiation. Therefore, since processing means is used to increase the dimension accuracy in the manufacturing of the case structure components, a problem may arise in that the cost of the case structure components increases. Further, the intensity of the unintentional electromagnetic radiation can be made to be small by further increasing the volume of the electromagnetic wave absorption material disposed inside the metal case. However, when a high-cost electromagnetic wave absorption material is abundantly used, a problem may arise in that the cost increases.

In the techniques described in Patent Document 1 or Non-Patent Document 1, the upper limit exists in a frequency band of transmission through the common mode choke coil. Therefore, the upper limit makes digital transmission difficult at a high frequency (or a high bit rate). Further, in the techniques described in Patent Document 2, the circuit size of the differential amplification IC is larger than that of a known simple differential driving IC. Therefore, a problem may arise in that the size and the power consumption of the differential amplification IC increase.

The invention is devised in the above-mentioned circumstance and an object of the invention is to provide a differential transmission circuit capable of suppressing unintentional electromagnetic radiation caused due to switching noise of a driving circuit that outputs a differential transmission signal while suppressing an increase in cost and an information processing system using the differential transmission circuit.

(1) According to an aspect of the invention, a differential transmission circuit, in which a differential transmission signal output by a driving circuit performing driving at a predetermined bit rate is transmitted, includes: a grounded conductive layer; a pair of transmission line conductors which is disposed on one side of the grounded conductive layer via a dielectric layer interposed therebetween; a conductive film which has a predetermined shape and is disposed between the grounded conductive layer and the pair of transmission line conductors; a via hole which connects the grounded conductive layer to the conductive film; a straight-line region in which the pair of transmission line conductors extends parallel to each other so as to have a first width; and a band rejection filter region in which the pair of transmission line conductors planarly overlaps the conductive film, when viewed from an upper side of the grounded conductive layer, and extends parallel to each other so as to have a second width narrower than the first width and a common mode of the differential transmission signal is attenuated at one of frequencies which are natural number multiples of a frequency corresponding to the predetermined bit rate.

(2) In the differential transmission circuit set forth in (1), when viewed from the upper side of the grounded conductive layer, a cross-section of the via hole may be intersected by a central line of inner edges of the pair of transmission line conductors in the band rejection filter region.

(3) In the differential transmission circuit set forth in (1), when viewed from the upper side of the grounded conductive layer, a cross-section of the via hole may be intersected by a central line of both ends in an extension direction of the band rejection filter region.

(4) In the differential transmission circuit set forth in one of (1) to (3), when viewed from the upper side of the grounded conductive layer, a cross-section of the via hole includes a point of a distance which may be 0.35 times or less a propagation wavelength in the differential transmission circuit of a frequency corresponding to the predetermined bit rate from an output terminal of the driving circuit.

(5) In the differential transmission circuit set forth in one of (1) to (3), a central frequency of a band for which the common mode of the differential transmission signal is attenuated may be 20 GHz or more. When viewed from the upper side of the grounded conductive layer, a cross-section of the via hole may include a point of a distance of 2.8 mm or less from an output terminal of the driving circuit.

(6) In the differential transmission circuit set forth in one of (1) to (3), a central frequency of a band for which the common mode of the differential transmission signal is attenuated may be 10 GHz or more. When viewed from the upper side of the grounded conductive layer, a cross-section of the via hole may include a point of a distance of 5.6 mm or less from an output terminal of the driving circuit.

(7) The differential transmission circuit set forth in one of (1) to (3) may further include another conductive film which has a predetermined shape and is disposed between the grounded conductive layer and the pair of transmission line conductors; and another via hole which connects the grounded conductive layer to the another conductive film. The differential transmission circuit may further include another band rejection filter region in which the pair of transmission line conductors planarly overlaps the another conductive film, when viewed from the upper side of the grounded conductive layer, and extends parallel to each other so as to have a third width narrower than the first width and the common mode of the differential transmission signal is attenuated at one of the frequencies which are the natural number multiples of the frequency corresponding to the predetermined bit rate.

(8) In the differential transmission circuit set forth in (7), in one of the band rejection filter region and the another band rejection filter region, the common mode of the differential transmission signal may be attenuated at the frequency corresponding to the predetermined bit rate. In the other of the band rejection filter region and the another band rejection filter region, the common mode of the differential transmission signal may be attenuated at a double frequency of the frequency corresponding to the predetermined bit rate.

(9) According to another aspect of the invention, an information processing system include: the differential transmission circuit set forth in one of (1) to (3); and a driving circuit.

(10) According to another aspect of the invention, an information processing system include: the differential transmission circuit set forth in one of (1) to (3); the driving circuit described above; and an optical modulator in which a differential input terminal is electrically connected to an output side of the differential transmission circuit. The optical modulator may be an open end for a common mode operation of a differential input.

(11) According to another aspect of the invention, an information processing system include: the differential transmission circuit set forth in one of (1) to (3); the driving circuit described above; and an optical transmitter module in which a differential input terminal is electrically connected to an output side of the differential transmission circuit. The optical transmitter module may be an open end for a common mode operation of a differential input.

(12) According to another aspect of the invention, an information processing system include: the differential transmission circuit set forth in one of (1) to (3); the driving circuit described above; an optical transmitter module in which a single-end input terminal is electrically connected to an output side of one of the transmission line conductors of the differential transmission circuit; and a termination resistor which is electrically connected to an output side of the other of the transmission line conductors of the differential transmission circuit.

(13) According to another aspect of the invention, an information processing system include: the differential transmission circuit set forth in one of (1) to (3); the driving circuit described above; and a shield lid which covers the driving circuit and a region including the band rejection filter region of the differential transmission circuit.

(14) According to another aspect of the invention, an information processing system include; the differential transmission circuit set forth in one of (7) and (8); the driving circuit described above; a shield lid which covers the driving circuit and a region including the band rejection filter region and the another band rejection filter region of the differential transmission circuit.

According to the aspects of the invention, it is possible to provide the differential transmission circuit capable of suppressing unintentional electromagnetic radiation caused due to switching noise of a driving circuit that outputs a differential transmission signal while suppressing an increase in cost and the information processing system using the differential transmission circuit.

BRIEF DESCRIPTION OF THE DRAWINGS

FIG. 28 is a perspective view illustrating the vicinity of a differential transmission line of an information processing system according to a fourth example of the related art which is a comparative example of the seventh embodiment of the invention.

DETAILED DESCRIPTION OF THE INVENTION

Embodiments of the invention will be described in detail below. The following drawings are referred to describe the embodiments, and the sizes and scales of the drawings are not necessarily identical with those used in the embodiments. Note that a differential transmission circuit according to the present invention may be defined as an electric circuit provided with a differential transmission line according to the present invention, and a differential transmission line is also referred to as a balanced line or differential line.

First Embodiment

A differential transmission line and an information processing system according to a first embodiment of the invention will be described.

Figure 1:
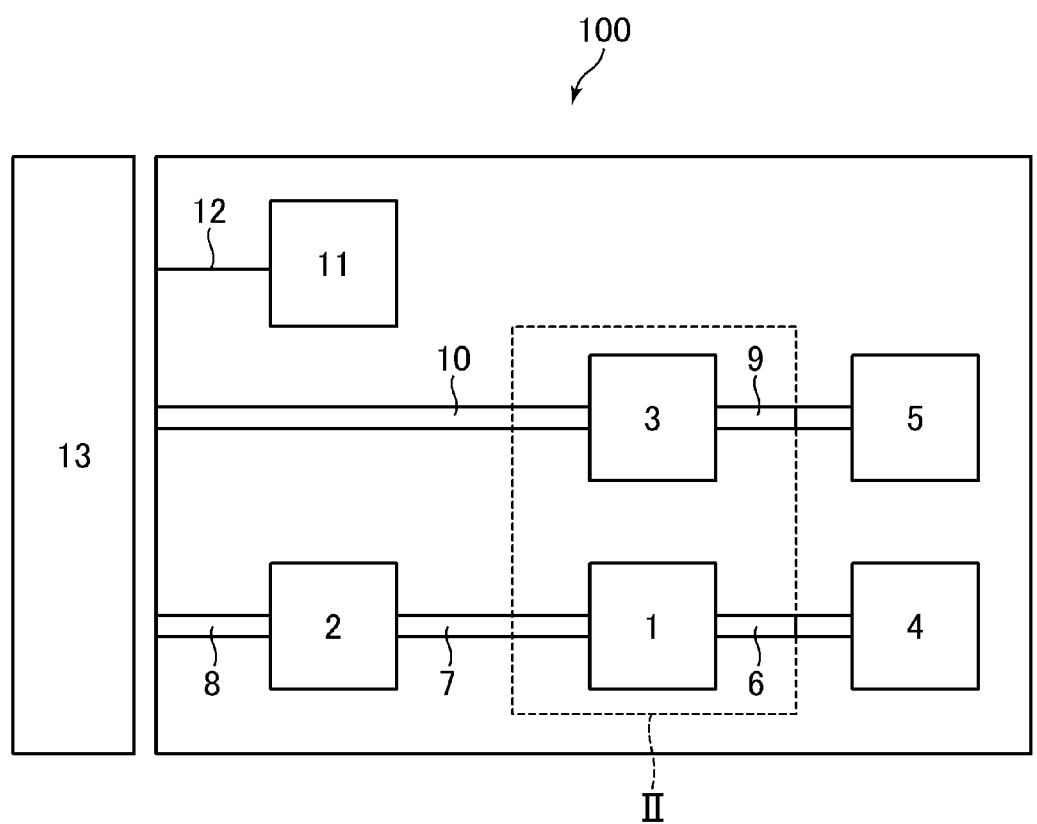
FIG. 1 is a block diagram illustrating an information processing system according to a first embodiment of the invention.

FIG. 1 is a block diagram illustrating an information processing system 100 according to the first embodiment of the invention. The information processing system 100 according to this embodiment includes a driving integrated circuit 1 (driver IC), a transmitter CDR (Clock Data Recovery) integrated circuit 2 having a CDR function, a receiver CDR integrated circuit 3, a receiver circuit 4, a transmitter circuit 5, a control unit 11, and a transmission device 13. The information processing system 100 is connected to the transmission device 13.

A transmission line is disposed between the driving integrated circuit 1 and the receiver circuit 4. Here, as described below, the transmission line includes a differential transmission line 6. A transmitter-side differential output transmission line 7 is disposed between the transmitter CDR integrated circuit 2 and the driving integrated circuit 1. A transmitter-side differential input transmission line 8 is disposed between the transmission device 13 and the transmitter CDR integrated circuit 2. An electric output signal, which is serial data, is transmitted as a differential transmission signal from the transmission device 13 to the transmitter CDR integrated circuit 2 via the transmitter-side differential input transmission line 8. The transmitter CDR integrated circuit 2 adds waveform shaping or the like (CDR function) to the electric output signal, and then transmits the electric output signal to the driving integrated circuit 1 via the transmitter-side differential output transmission line 7. The driving integrated circuit 1 amplifies the electric output signal and transmits the amplified electric output signal to the receiver circuit 4 via the transmission line such as the differential transmission line 6.

Here, the driving integrated circuit 1 is a driving circuit that amplifies a serial data signal. When the digital modulation of the information processing system 100 is binary amplitude modulation and the bit rate of the digital modulation is 10 Gbit/s, the driving integrated circuit 1 serves as a driving circuit that performs driving at a bit rate of 10 Gbit/s. In the driving integrated circuit 1, unintended electromagnetic radiation occurs at a frequency of a natural number multiple of 10 GHz, which is the frequency corresponding to the bit rate, for example, 10 GHz, 20 GHz, and the like. Here, the driving integrated circuit 1 is a driver IC. The driving circuit is not limited to the driver IC, but may be a driving circuit that performs driving at a predetermined bit rate.

A transmission line is disposed between the receiver CDR integrated circuit 3 and the transmitter circuit 5. The transmission line includes a receiver-side differential input transmission line 9. A receiver-side differential output transmission line 10 is disposed between the transmission device 13 and the receiver CDR integrated circuit 3. An electric signal output by the transmitter circuit 5 is transmitted via the transmission line and is transmitted as a differential signal to the receiver CDR integrated circuit 3 via the receiver-side differential input transmission line 9. Further, waveform shaping or the like is added to the electric input signal input into the receiver CDR integrated circuit 3, and then the electric input signal is transmitted to the transmission device 13 via the receiver-side differential output transmission line 10.

A control signal is input from the transmission device 13 to the control unit 11 via a digital communication interface 12. Based on the input control signal, the control unit 11 controls driving of the driving integrated circuit 1, the transmitter CDR integrated circuit 2, and the receiver CDR integrated circuit 3. In the information processing system 100 according to this embodiment, the transmitter CDR integrated circuit 2 is separated from the receiver CDR integrated circuit 3. However, the information processing system may include a transceiver integral-type CDR integrated circuit.

Figure 2:
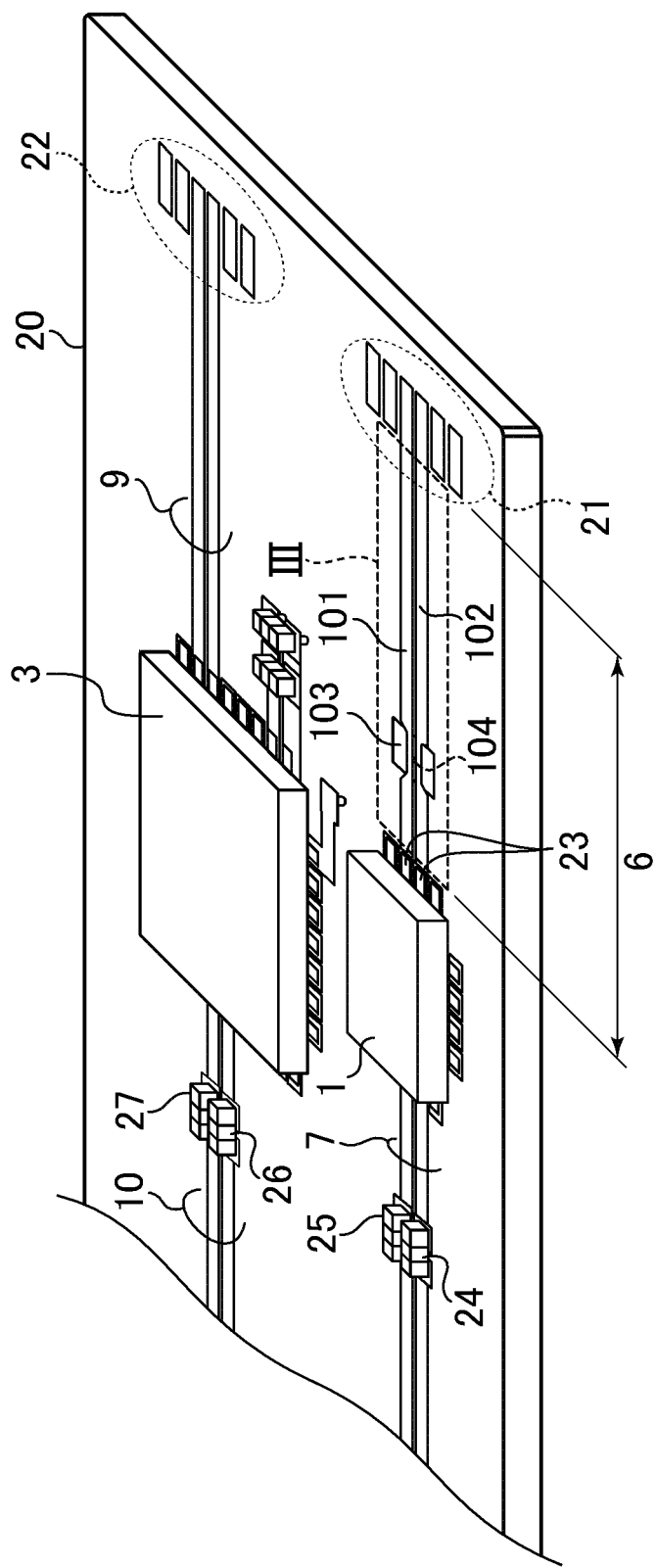
FIG. 2 is a perspective view illustrating the vicinity of a differential transmission line of the information processing system according to the first embodiment of the invention.

FIG. 2 is a perspective view illustrating the vicinity of the differential transmission line 6 of the information processing system 100 according to this embodiment. FIG. 2 shows a region II surrounded by a dashed line in FIG. 1. FIG. 2 shows an electronic circuit portion of the information processing system 100 that transmits an electric signal which is the serial data. The driving integrated circuits and the differential transmission lines described above are disposed on a printed circuit substrate 20.

The characteristics of the invention are the configuration of the differential transmission line 6. The differential transmission line 6 is a pair (two) of microstrip transmission lines that include a grounded conductive layer 110 (not shown) and a pair of transmission line conductors disposed in the same layer via a dielectric layer 35 (not shown) interposed therebetween on one side (here, the upper side) of the grounded conductive layer 110. Here, a pair of transmission line conductors is a first strip conductor 101 and a second strip conductor 102. An intermediate conductive film 103 and a via hole 104 are disposed in the halfway portion of the differential transmission line 6, and a resonant circuit is formed between the pair of transmission line conductors and the grounded conductive layer 110.

As shown in FIG. 2, one end (left end) of the pair of transmission line conductors of the differential transmission line 6 are respectively connected to a pair of connection pads and are solder-connected to a pair of transmitter-side differential output terminals 23 of the driving integrated circuit 1 in the connection pads. Further, the other end (right end) of the pair of transmission line conductors are connected to FPC (Flexible Printed Circuit) connection terminals 21. The electric output signal output to the differential transmission line 6 by the driving integrated circuit 1 is transmitted to the receiver circuit 4 (not shown) via an FPC (not shown) connected to the FPC connection terminals 21.

Likewise, one end (left end) of a pair of transmission line conductors of the receiver-side differential input transmission line 9 are respectively connected to a pair of connection pads and are respectively solder-connected to a pair of receiver-side differential input terminals of the receiver CDR integrated circuit in the connection pads. The other end (right end) of the pair of transmission line conductors are connected to the FPC connection terminals 22. An electric signal output by the transmitter circuit 5 (not shown) is transmitted to an FPC (not shown) and is transmitted as a differential signal to the receiver CDR integrated circuit 3 via the FPC connection terminals 22 and the receiver-side differential input transmission line 9.

DC-cut capacitors 24 and 25 are installed in the two transmission line conductors of the transmitter-side differential output transmission line 7 connected to the driving integrated circuit 1, respectively. Likewise, DC-cut capacitors 26 and 27 are installed in the two transmission line conductors of the receiver-side differential output transmission line 10 connected to the receiver CDR integrated circuit 3. For example, the DC-cut capacitors are surface-mount type capacitors with a 1005 size of capacitance value of 0.1 μF. However, the DC-cut capacitors may be removed, as unnecessary.

Figure 3:
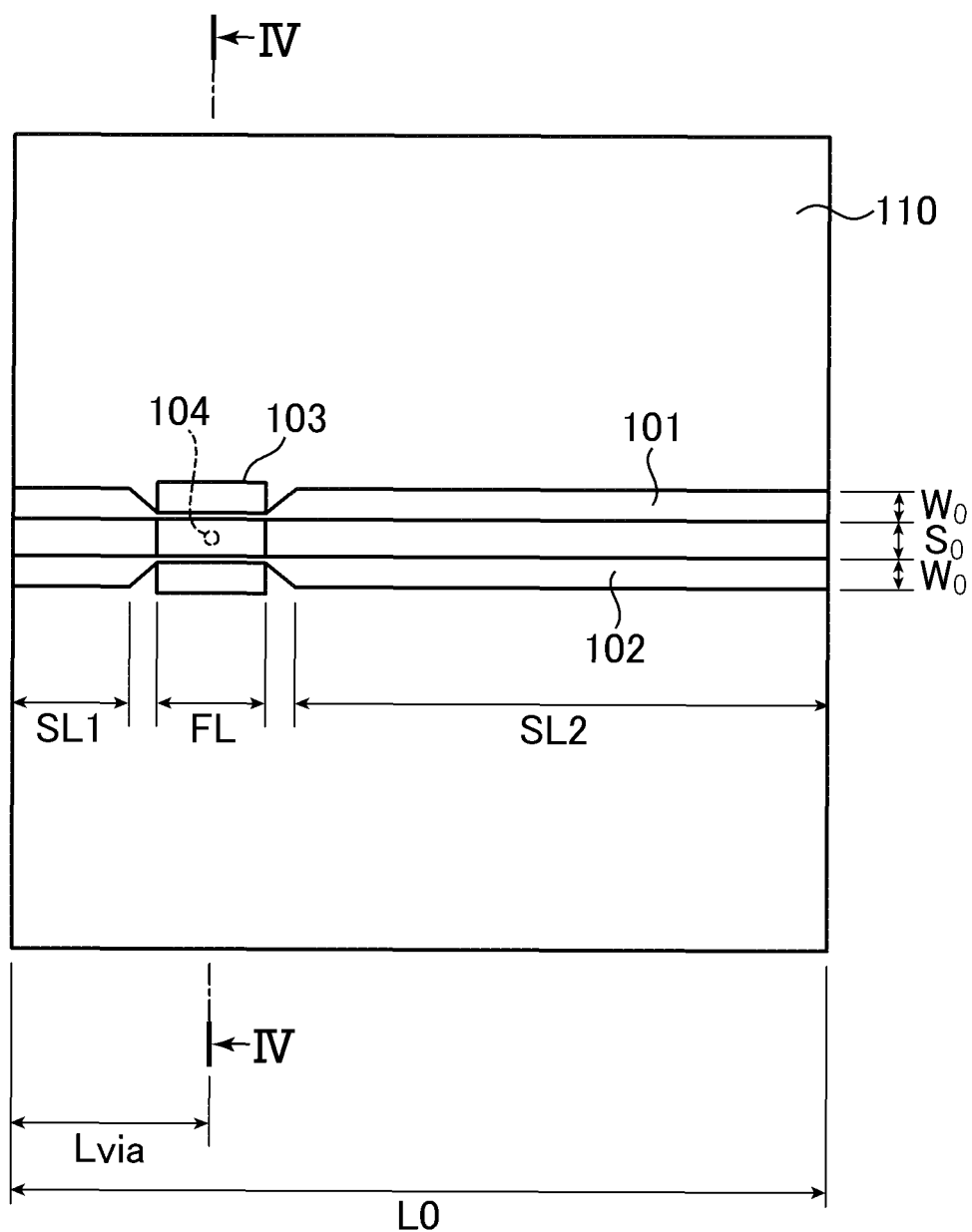
FIG. 3 is a top view illustrating a differential transmission line according to the first embodiment of the invention.

FIG. 3 is a top view illustrating the differential transmission line 6 according to this embodiment. FIG. 3 shows a region III indicated by a dashed line in FIG. 2. The differential transmission line 6 is formed on the printed circuit substrate 20. As described above, the differential transmission line 6 includes the first strip conductor 101, the second strip conductor 102, the intermediate conductive film 103, the via hole 104, and the grounded conductive layer 110. As shown in FIG. 3, the differential transmission line 6 includes a first straight-line region SL1 (straight-line region), a band rejection filter region FL, and a second straight-line region SL2.

As shown in FIG. 3, the first strip conductor 101 and the second strip conductor 102, which are a pair of transmission line conductors, extend to be parallel to each other rightward from a pair of connection pads to which the transmitter-side differential output terminal 23 (not shown) of the driving integrated circuit 1 is connected. A space S0 between the first strip conductor 101 and the second strip conductor 102 is constant, as shown in FIG. 3. Here, the space S0 is a distance between the inner edges of the pair of transmission line conductors and is a distance between the lower edge of the first strip conductor 101 and the upper edge of the second strip conductor 102. The widths of the first strip conductor 101 and the second strip conductor 102 are the same as each other and are a width W0 which is a first width in the first straight-line region SL1. As the first strip conductor 101 and the second strip conductor 102 extend rightward between the first straight-line region SL1 and the band rejection filter region FL, the widths are gradually narrowed and become a width WF, which is the second width, in the band rejection filter region FL. Further, as the first strip conductor 101 and the second strip conductor 102 extend rightward between the band rejection filter region FL and the second straight-line region SL2, the widths are gradually thickened and become the width W0, which is the first width, in the second straight-line region SL2. In the band rejection filter region FL, the intermediate conductive film 103 with a rectangular shape, which is a predetermined shape, is disposed between the pair of transmission line conductors and the grounded conductive layer 110, as shown in FIG. 3. The intermediate conductive film 103 and the grounded conductive layer 110 are connected to each other by the via hole 104. When viewed from the upper side of the grounded conductive layer 110, the pair of transmission line conductors and the intermediate conductive film 103 planarly overlap each other in the band rejection filter region FL. Here, both ends of the band rejection filter region FL in the extension direction (horizontal direction in the drawing) are assumed to be both ends of a portion in which the pair of transmission line conductors extends with the second width in the region where the pair of transmission line conductors and the intermediate conductive film 103 planarly overlap each other. In FIG. 3, both ends in the extension direction of the band rejection filter region FL are indicated by vertical lines. The central line of both ends is indicated by the line IV-IV in FIG. 3.

The dimension of each portion in the differential transmission line 6 may be designed in accordance with the layer configuration of the printed circuit substrate 20, the relative permittivity of the dielectric layer 35, and the like. An example of the dimensions of each portion of the differential transmission line 6 according to this embodiment will be described below. The space S0 between the pair of transmission line conductors is 0.495 mm, and a line length L0 of the differential transmission line 6 is the distance between the connection pads to the FPC connection terminals 21. Here, the line length L0 is 14 mm. In the first straight-line region SL1 and the second straight-line region SL2, the first width (the width W0) of the pair of transmission line conductors is 0.39 mm. In the band rejection filter region FL, the second width (the width WF) which is the width of the band rejection filter region FL is 0.1 mm. The second width is narrower than the first width. In each region, each width of the pair of transmission line conductors is determined so that a desired specific impedance is obtained. Here, in a differential mode, a specific impedance Zdiff is determined so as to become 100Ω.

In the band rejection filter region FL, as described above, a resonant circuit is formed by the pair of transmission line conductors, the intermediate conductive film 103, the via hole 104, and the grounded conductive layer 110. The size of the intermediate conductive film 103 and the size of the via hole 104 are determined so that the resonant frequency of the resonant circuit has a desired value. Here, the intermediate conductive film 103 has a rectangular shape of 1.5 mm by 1.5 mm and the via hole 104 with a diameter of 0.2 mm is disposed in the middle of the intermediate conductive film 103 so that the resonant frequency is near 21 GHz. That is, when viewed from the upper side of the grounded conductive layer 110, the center of the via hole 104 is on the central line of both right and left ends (both ends in the extension direction of the pair of transmission line conductors) of the band rejection filter region FL and the cross-section of the via hole 104 is intersected by the central line of both ends of the band rejection filter region FL. Further, when viewed from the upper side of the grounded conductive layer 110, the center of the via hole 104 is on the central line of the pair of transmission line conductors in the band rejection filter region FL and the cross-section of the via hole 104 is intersected by the central line of the inner edges of the pair of transmission line conductors.

A distance Lvia between one end (left end) of the differential transmission line 6, that is, the connection pads and the center of the via hole 104 is 2.2 mm. The distance Lvia is a length that corresponds to $0.26 \times \lambda g$ at the frequency of 19.9 GHz and $0.30 \times \lambda g$ at the frequency of 22.6 GHz for a propagation wavelength $\lambda g$ in the differential transmission line.

Figure 4:
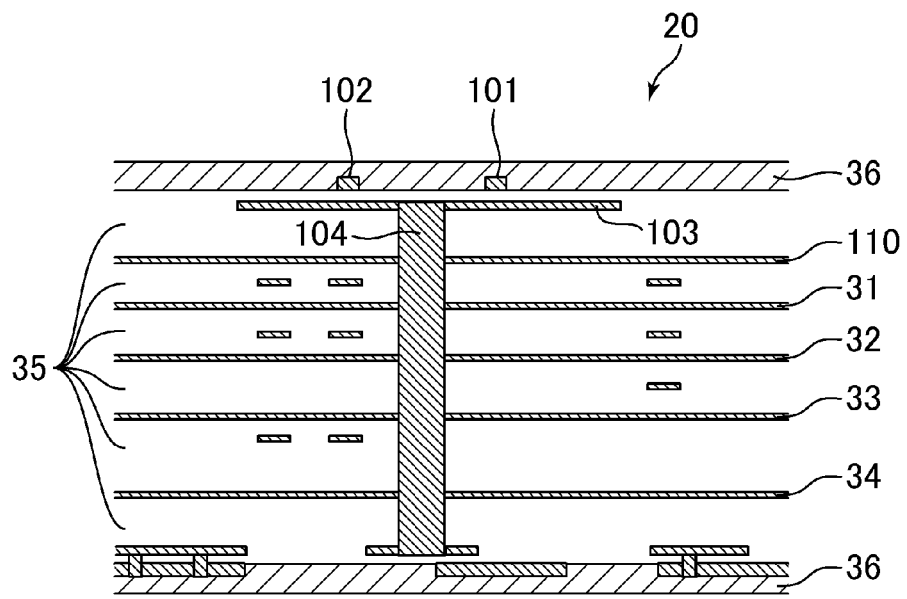
FIG. 4 is a sectional view illustrating the differential transmission line according to the first embodiment of the invention.

FIG. 4 is a sectional view illustrating the differential transmission line 6 according to this embodiment. FIG. 4 shows the cross-section taken along the line IV-IV of FIG. 3 and shows the vertical structure of the printed circuit substrate 20. The differential transmission line 6 is formed on the surface (the upper surface) of the printed circuit substrate 20. As described above, the first strip conductor 101 and the second strip conductor 102, which are the pair of transmission line conductors, are disposed on one side (here, the upper side) of the grounded conductive layer 110 via the dielectric layer 35 interposed therebetween. Further, the intermediate conductive film 103 is disposed between the pair of transmission line conductors and the grounded conductive layer 110.

The dielectric layer 35 is formed of a glass cloth material and a material such as an epoxy resin. The relative permittivity of the material is 3.6. The distance between the grounded conductive layer 110 and the pair of transmission line conductors is 0.279 mm and the distance between the grounded conductive layer 110 and the intermediate conductive film 103 is 0.192 mm. The values of these distances are determined so that the resonant frequency of the resonant circuit has a desired value, as in the size of the intermediate conductive film 103 or the size of the via hole 104. The pair of transmission line conductors, the intermediate conductive film 103, and the grounded conductive layer 110 are formed such that a desired shape is patterned after a copper foil is laminated. Here, the thickness of the first strip conductor 101 and the second strip conductor 102, which are the pair of transmission line conductors, is 0.053 mm and the thickness of the intermediate conductive film 103 is 0.033 mm.

In the printed circuit substrate 20, a plurality of grounded conductive layers 31, 32, 33, and 34 are disposed via the dielectric layers 35 interposed therebetween in the lower side of the grounded conductive layer 110, and wirings formed of a conductor are disposed between the grounded conductive layers. The via hole 104 electrically connects the intermediate conductive film 103 to the grounded conductive layer 110. As shown in FIG. 4, the via hole 104 electrically connects the grounded conductive layer 110 to the other grounded conductive layers 31, 32, 33, and 34. The ground voltages of the grounded conductive layers are more stably retained by the via hole 104. The via hole 104 is a cylindrical conductor and is formed by applying a copper coat to a hole formed by a drill. The via hole 104 may be a laser via hole formed using a through hole by laser processing. Protective films 36 called solder resist are formed on the upper and lower surfaces of the printed circuit substrate 20, but may be removed, as unnecessary. Here, the protective films 36 are formed of a material with a relative permittivity of 4.4 and the thicknesses of the protective films 36 are 0.082 mm.

The pair of transmission line conductors of the differential transmission line 6 is preferably formed in the same layer in terms of a reduction in transmission loss. Further, the width and the thickness of the pair of transmission line conductors are preferably the same as each other. The space S0 between the first strip conductor 101 and the second strip conductor 102 is preferably identical and constant in the straight-line region and the band rejection filter region. However, the invention is not limited thereto. The space S0 in the band rejection filter region may be different from the space S0 in the straight-line region. Even in this case, the pair of transmission line conductors preferably extends to be symmetric with respect to the central line. That is, the central lines of the inner edges of the pair of transmission line conductors are preferably straight lines.

The center of the via hole 104 is preferably on the central line of the inner edges of the pair of transmission line conductors in terms of the reduction in the transmission loss, but the invention is not limited thereto. Likewise, the center of the via hole 104 is preferably on the central line of both ends of the band rejection filter region in the extension direction, but the invention is not limited thereto.

In the information processing system 100 according to this embodiment, the serial data is transmitted via the transmission line formed from the FPC between the FPC connection terminals 21 and the receiver circuit 4. However, the transmission line is not limited to the FPC. The transmission line may be a coaxial line, an FFC (Flexible Flat Cable), a twisted-pair line, or the like. The FPC connection terminals 21 and 22 may be substituted by corresponding conversion connectors depending on the transmission line.

The information processing system 100 according to this embodiment is the information processing system that transmits the serial data as the electric signal via the transmission line formed from the FPC connected to the FPC connection terminals 21, but the invention is not limited thereto. For example, the information processing system 100 may be an information processing system called an optical transceiver in which an optical transmitter module is connected to the FPC connection terminals 21 and an optical receiver module is connected to the FPC connection terminal 22 to transmit the serial data as optical signals.

The configurations of the differential transmission line 6 and the information processing system 100 according to this embodiment have hitherto been described. Next, the advantages of the differential transmission line 6 according to this embodiment will be described.

Figure 5:
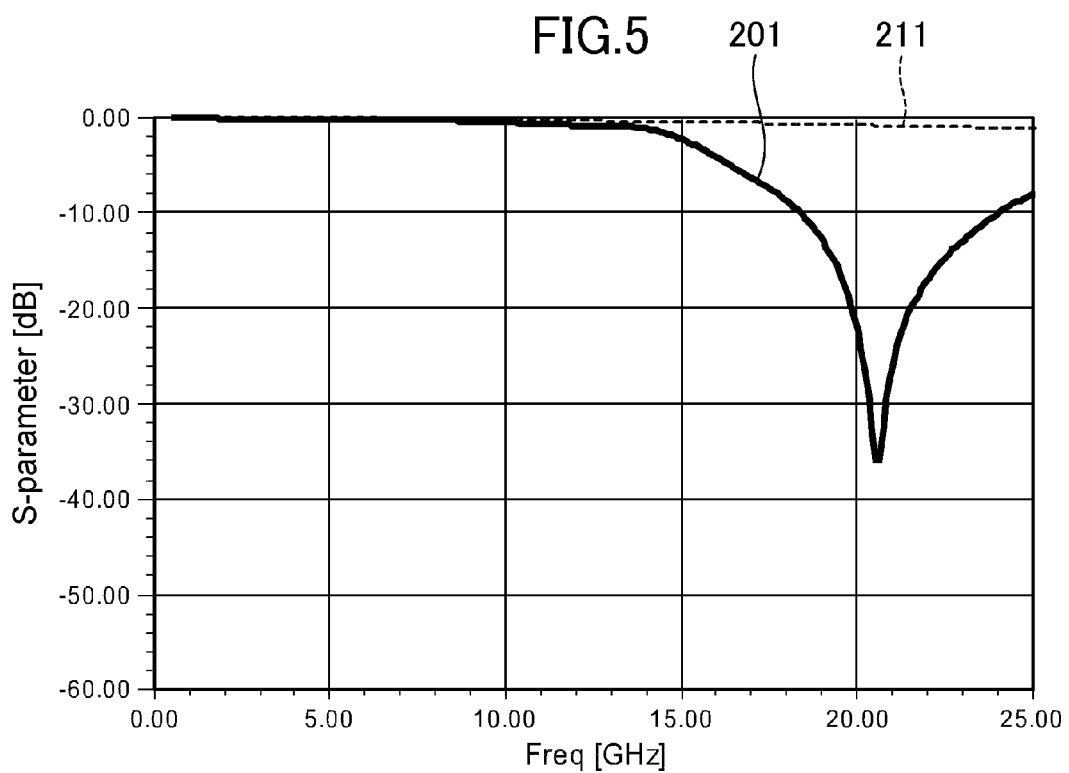
FIG. 5 is a diagram illustrating an analysis result of the differential transmission line according to the first embodiment of the invention.

FIG. 5 is a diagram illustrating an analysis result of the differential transmission line 6 according to this embodiment. The analysis result is a result obtained by analyzing the configuration of the differential transmission line 6 by a three-dimensional electromagnetic field structure analysis tool. FIG. 5 shows a frequency dependency of insertion loss in common-mode (Scc21) and insertion loss in differential-mode (Sdd21). In the drawing, the frequency dependencies are shown as a common mode 201 and a differential mode 211. Here, a reference impedance is set to 100Ω for the differential mode and is set to 25Ω for the common mode to perform the analysis.

In the differential mode 211, as shown in FIG. 5, good characteristics are obtained in that the loss is small in the frequency region shown in the drawing. On the other hand, in the common mode 201, a deep dip of −35 dB is shown at the frequency of 20.5 GHz, and thus the steep characteristics of the band rejection filter circuit in which the central frequency is 20.5 GHz can be obtained. Accordingly, when an electric output signal is transmitted at the bit rate of 10 Gbit/s, more specifically, at one bit rate in the range of 9.95 Gbit/s to 11.3 Gbit/s, in the information processing system 100 according to this embodiment, conduction propagation in the differential transmission line 6 is inhibited in the common mode of the double frequency (a frequency of 19.9 GHz to 22.6 GHz) of a frequency corresponding to the bit rate in spite of the fact that a common mode noise is contained in the differential transmission signal output by the driving integrated circuit 1. Thus, the reduction in the unintentional electromagnetic radiation and the securement of signal integrity are compatible.

As described above, the common mode noise occurs at a frequency which is a natural number multiple of a frequency corresponding to a predetermined bit rate at which the driving circuit performs driving. When the intermediate conductive film or the via hole is disposed so that the resonant frequency of the resonant circuit formed in the band rejection filter region is the same as or is close to the frequency which is a natural number multiple of the frequency corresponding to the predetermined bit rate, the common mode noise of the frequency which is the natural number multiple of the frequency corresponding to the predetermined bit rate is reduced by the band rejection filter region of the differential transmission line. In particular, the problematic frequency in the common mode noise is frequency (once) corresponding to the predetermined bit rate or the double frequency of this frequency. Therefore, it is desirable to provide the band rejection filter region so that the common mode noise of one of the frequency or the double frequency of the frequency is reduced.

In the differential transmission line 6 according to this embodiment, the distance Lvia between the connection pads and the center of the via hole 104 is set to 2.2 mm, but the invention is not limited to this value. A value may be selected in a range described below.

As described above, the characteristics of the band rejection filter circuit in which the central frequency is 20.5 GHz can be obtained in the differential transmission line 6 by the resonant circuit formed in the band rejection filter region FL of the differential transmission line 6 according to this embodiment. Therefore, the band rejection filter region FL of the differential transmission line 6 has the function of a common mode band rejection filter circuit that inhibits the conduction propagation of the common mode noise near this frequency.

The central position of the common mode band rejection filter circuit in the band rejection filter region FL corresponds to the position of the via hole 104. In a region (the second straight-line region SL2) more distant from the common mode band rejection filter circuit of the differential transmission line 6 when viewed from the driving integrated circuit 1, the conduction propagation of the noise corresponding to a common mode signal component is inhibited in the differential transmission line 6, thereby reducing the unintentional electromagnetic radiation caused due to the loss of the radiation from the differential transmission line 6. On the other hand, when attention is paid to the unintentional electromagnetic radiation in the region from the transmitter-side differential output terminal 23 of the driving integrated circuit 1 to the common mode band rejection filter circuit, the intensity of the unintentional electromagnetic radiation is preferably less than the intensity of electromagnetic radiation from a distant region. The common mode band rejection filter circuit operates for the common mode signal so as to be short-circuited at the central frequency (resonant frequency). In the light of a simple model, the common mode signal component of the differential transmission signal output by the driving integrated circuit 1 is looped from the transmitter-side differential output terminals 23 to the driving integrated circuit 1 via the pair of transmission line conductors, the via hole 104, and the grounded conductive layer 110. When the length of the loop path is identical with an integral multiple of the propagation wavelength λg, input impedance is 0, and thus there is a concern that a good loop antenna may be configured. In this case, there is a possibility that the unintentional electromagnetic radiation may increase since the radiation efficiency increases in the regions (the first straight-line region SL1 and the band rejection filter region SL) from the transmitter-side differential output terminal 23 to the common mode band rejection filter circuit in the differential transmission line 6. The loop length of the loop is almost the double length of the distance Lvia between the connection pads and the center of the via hole 104, and it is first expected that the vicinity of an integral multiple of λg/2 has to be avoided as the value of the distance Lvia.

Next, when the loop path forms a good loop antenna with the input impedance of 0, the intensity of the electromagnetic radiation is calculated by an equation provided in a simple model. This model is set to a loop antenna model. The maximum electric field intensity E at a distant field radiated from an ideal loop antenna is expressed in the following equation, as generally known. This equation is referred to as Equation 1.

$$E = \frac{Z_0 \pi I A}{\lambda_g(f)^2 D} \quad \text{[Equation 1]}$$

In this equation, $Z_0$ is free-space impedance (377Ω), I is a loop current, A is a loop area, $\lambda g$ is a propagation wavelength, and D is a distance (3 m) up to an observation position. When it is assumed that h (0.279 mm) is the height of the dielectric substance from the grounded conductive layer 110 to the pair of transmission line conductors in the case of the differential transmission line 6 according to this embodiment and Lvia is the distance between the connection pads to the center of the via hole 104, the loop path corresponds to a rectangle with the height h and the length Lvia and the loop area A is described as A=h×Lvia. When it is assumed that vg is the group speed of the differential transmission line 6, the propagation wavelength (which changes depending on a frequency f) $\lambda g$ can be described as $\lambda g=vg/f$. Since the group speed vg is constant without dependency on the frequency when the relative permittivity of the dielectric layer 35 is constant, the group speed can be relatively easily calculated compared to the cross-sectional configuration of the differential transmission line 6. In the case of the configuration of the differential transmission line 6 according to this embodiment, vg is 1.66×108 m/s. When this description is substituted into Equation 1 above, the following equation can be obtained. This equation is referred to as Equation 2.

$$E = \frac{Z_0 \pi I h}{v_g^2 D} \cdot L_{via} \cdot f^2 \quad \text{[Equation 2]}$$

Figure 6:
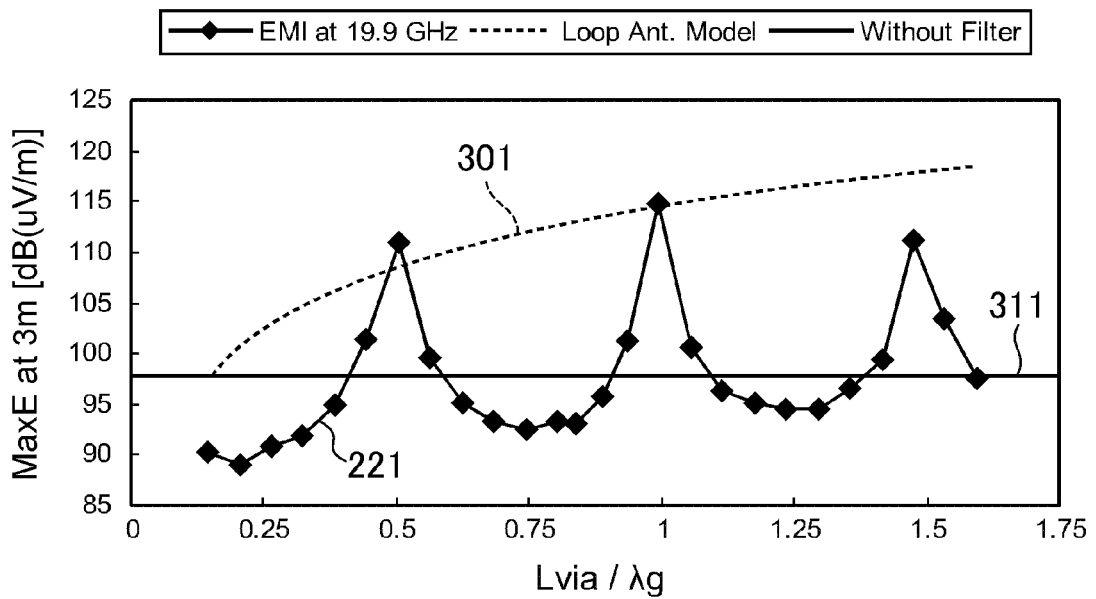
FIG. 6 is a diagram illustrating dependency of the intensity of unintentional electromagnetic radiation from the differential transmission line with respect to a distance Lvia according to the first embodiment of the invention.
Figure 7:
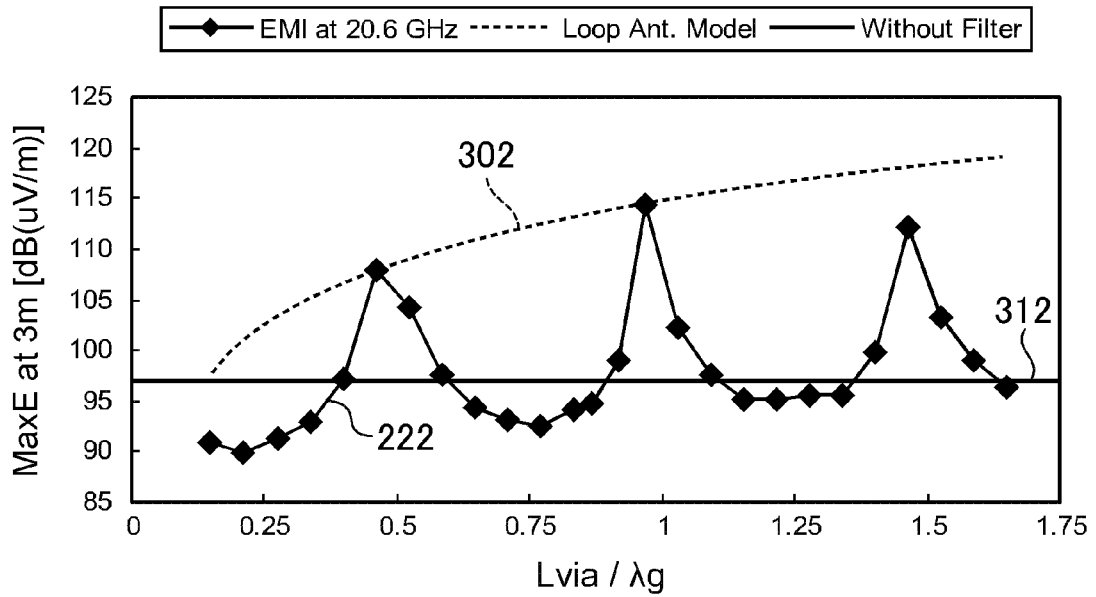
FIG. 7 is a diagram illustrating dependency of the intensity of the unintentional electromagnetic radiation from the differential transmission line with respect to the distance Lvia according to the first embodiment of the invention.
Figure 8:
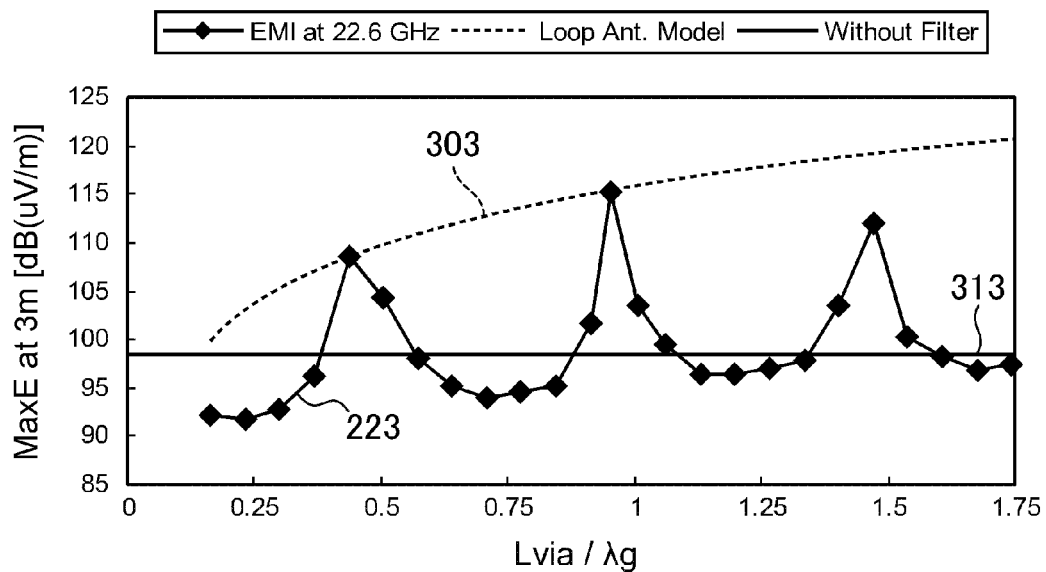
FIG. 8 is a diagram illustrating dependency of the intensity of the unintentional electromagnetic radiation from the differential transmission line with respect to the distance Lvia according to the first embodiment of the invention.

FIGS. 6 to 8 are diagrams illustrating the dependency of the intensity of the unintentional electromagnetic radiation from the differential transmission line 6 according to this embodiment with respect to the distance Lvia. That is, FIGS. 6 to 8 show the dependency of the intensity of the unintentional electromagnetic radiation of a representative frequency near the central frequency of the common mode band rejection filter circuit with respect to the distance Lvia in the unintentional electromagnetic radiation from the differential transmission line 6, when the differential transmission signal is output from the driving integrated circuit in the differential transmission line 6 according to this embodiment. FIG. 6 shows the frequency f of 19.9 GHz as the representative frequency. FIG. 7 shows the frequency f of 20.6 GHz as the representative frequency. FIG. 8 shows the frequency f of 22.6 GHz as the representative frequency.

First, when it is assumed that the common mode output impedance of the driving integrated circuit 1 is 25Ω and an output voltage is 1 V, the loop current I is 0.04 A. The characteristic (model characteristic) of the maximum electric field intensity E obtained from Equation 2 provided in the loop antenna model at the respective frequencies is shown by dashed lines as a model characteristic 301 in FIG. 6, as a model characteristic 302 in FIG. 7, and as a model characteristic 303 in FIG. 8. For example, when Lvia/$\lambda g$ is 0.5 and the frequency f is 19.9 GHz, 108 dB (μV/m) can be obtained in the model characteristic 301. When the frequency f is 20.6 GHz, 109 dB (μV/m) can be obtained in the model characteristic 302. When the frequency f is 22.6 GHz, 110 dB (μV/m) can be obtained in the model characteristic 303.

Figure 25:
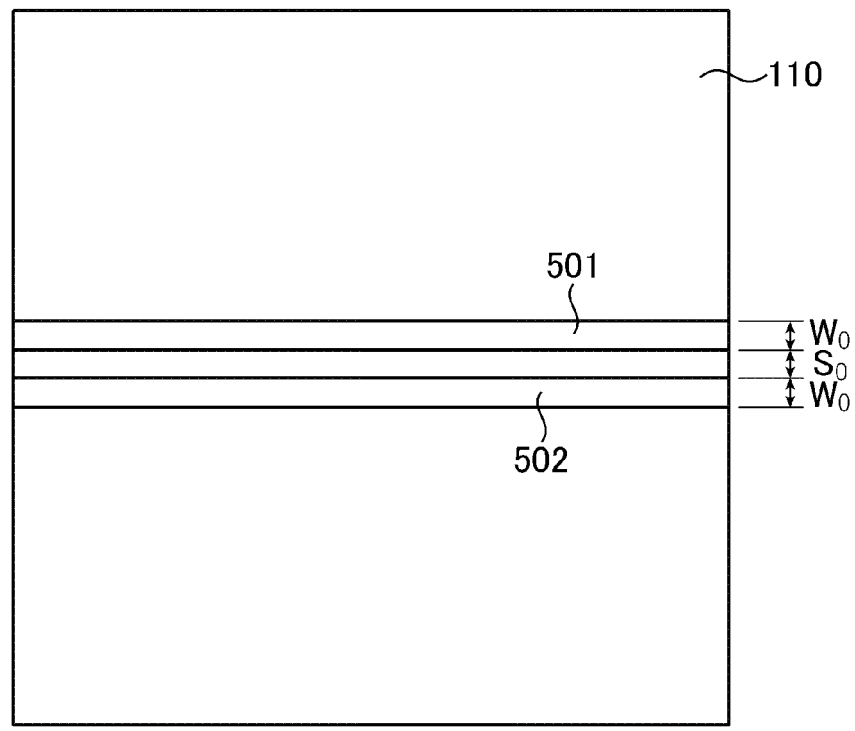
FIG. 25 is a top view illustrating a differential transmission line according to a first example of the related art which is a comparative example of the first embodiment of the invention.

FIG. 25 is a top view illustrating a differential transmission line according to a first example of the related art which is a comparative example of this embodiment. The differential transmission line according to the first example of the related art shown in FIG. 25 is different from the differential transmission line 6 according to this embodiment in that the width of each of a pair of transmission line conductors is a first width (width W0) in all of the regions, the intermediate conductive film 103 and the via hole 104 are not present, and the band rejection filter region FL is not present. The dimensions (the width W0, the distance S0, the line length L0, the cross-sectional configuration, and the like are the same) of the other portions are the same as those of the differential transmission line 6 according to this embodiment.

Likewise, the maximum electric field intensity E at the distance of 3 m when the differential transmission line according to the first example of the related art is calculated using a three-dimensional configuration analysis tool. The calculated maximum electric field intensity E is as follows. When the frequency f is 19.9 GHz, the maximum electric field intensity E is 98 dB (μV/m) and is shown as a characteristic 311 of the related art by a solid line in FIG. 6. Likewise, when the frequency f is 20.6 GHz, the maximum electric field intensity E is 97 dB (μV/m) and is shown as a characteristic 312 of the related art by the sold line in FIG. 7. When the frequency f is 21.6 GHz, the maximum electric field intensity E is 98 dB (μV/m) and is shown as a characteristic 313 of the related art by the sold line in FIG. 8.

In the differential transmission line 6 according to this embodiment, electromagnetic radiation is analyzed by a three-dimensional electromagnetic field structure analysis tool when the distance Lvia between the connection pads to the center of the via hole 104 is changed. The calculation results of the maximum electric field intensities E obtained through the analysis are shown as characteristics 221, 222, and 223 by lozenges in FIGS. 6 to 8, respectively.

When the characteristics of this embodiment obtained from the differential transmission line 6 according to this embodiment are compared to the characteristics of the related art obtained from the differential transmission line of the first example of the related art, the electromagnetic radiation from the region to the common mode band rejection filter circuit increases more than the electromagnetic radiation from the differential transmission line (the straight-line region) of the first example of the related art in the maximum electric field intensity E of this embodiment, for example, when Lvia/$\lambda g$ is near ½, that is, when a good loop antenna is formed. Accordingly, it is clear that the vicinity of an integral multiple of $\lambda g/2$ has to be avoided as the value of the distance Lvia.

As described above, the distance Lvia is set to 2.2 mm in the differential transmission line 6 according to this embodiment. Therefore, the distance Lvia is a length corresponding to 0.26×$\lambda g$ at the frequency of 19.9 GHz and a length corresponding to 0.30×$\lambda g$ at the frequency of 22.6 GHz with respect to the propagation wavelength $\lambda g$ in the differential transmission line 6. Therefore, the distance Lvia is smaller than $\lambda g/2$. When the common mode band rejection filter circuit is disposed at this position, the maximum electric field intensity E formed by the electromagnetic radiation from the differential transmission line 6 is calculated as 91 dB (μV/m), 91 dB (μV/m), and 92 dB (μV/m), respectively, when the frequency f is 19.9 GHz, 20.6 GHz, and 22.6 GHz. Accordingly, in the differential transmission line 6 according to this embodiment, the maximum electric field intensity E of 6 dB to 7 dB can be reduced compared to the differential transmission line according to the first example of the related art.

Therefore, it is possible to obtain the advantage of reducing the unintentional electromagnetic radiation.

Attention will be paid to case where the distance Lvia is changed in the differential transmission line 6 according to this embodiment. As shown in FIGS. 6 to 8, the maximum electric intensity E has the peaks near Lvia/$\lambda$g of 0.5, 1, and 1.5. The value of the maximum electric intensity E having the peaks at Lvia/$\lambda$g of 0.5 and 1 is satisfactorily identical with the value (model characteristic) of Equation 2 provided in the loop antenna model. Accordingly, the operation of the electromagnetic radiation at the central frequency of the common mode band rejection filter circuit is well described by the loop antenna model. Further, in FIGS. 6 to 8, it is clearly shown that it is possible to obtain the advantage of reducing the unintentional electromagnetic radiation without dependency on the frequency in the frequency range (19.9 GHz to 20.6 GHz) corresponding to the common mode band rejection filter circuit when the distance Lvia is 0.35×$\lambda$g or less, in comparison of the characteristics between this embodiment and the first example of the related art.

In this embodiment, the distance Lvia is set to 2.2 mm, but the invention is not limited thereto. Any value may be used as long as the distance Lvia is 0.35×$\lambda$g or less.

Figure 9:
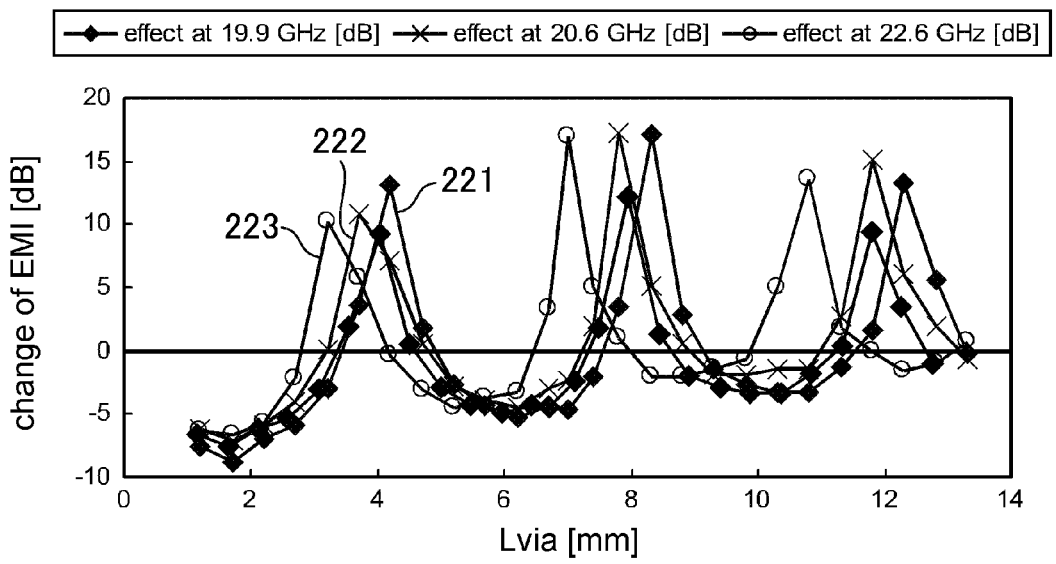
FIG. 9 is a diagram illustrating dependency of the intensity of the unintentional electromagnetic radiation from the differential transmission line with respect to the distance Lvia according to the first embodiment of the invention.

FIG. 9 is a diagram illustrating the dependency of the intensity of the unintentional electromagnetic radiation from the differential transmission line 6 with respect to the distance Lvia according to this embodiment. FIG. 9 shows the overlapping characteristics (the characteristics 221, 222, and 223 of this embodiment) of the differential transmission line 6 at the representative frequencies shown in FIGS. 6 to 8. When the central frequency of the common mode band rejection filter circuit is set to a frequency of 20.5 GHz and a frequency of 20 GHz or more, the correspondence of the frequency range can be achieved. Therefore, it is possible to obtain the advantage of reducing the unintentional electromagnetic radiation compared to the differential transmission line according to the first example of the related art, when the distance Lvia is 2.8 mm or less, as shown in FIG. 9. Accordingly, in this embodiment, the distance Lvia is set to 2.2 mm. However, the value of the distance Lvia may be modified as long as the distance Lvia is 2.8 mm or less.

Second Embodiment

The basic configuration of the information processing system 100 according to a second embodiment of the invention is the same as that of the information processing system 100 according to the first embodiment. However, the configuration of the information processing system 100 according to the second embodiment is different from that of the information processing system 100 according to the first embodiment in that the desired characteristic impedance Zdiff in the differential mode of the differential transmission line 6 is 50$\Omega$ and the central frequency of the common mode band rejection filter circuit is near 10 GHz.

Figure 10:
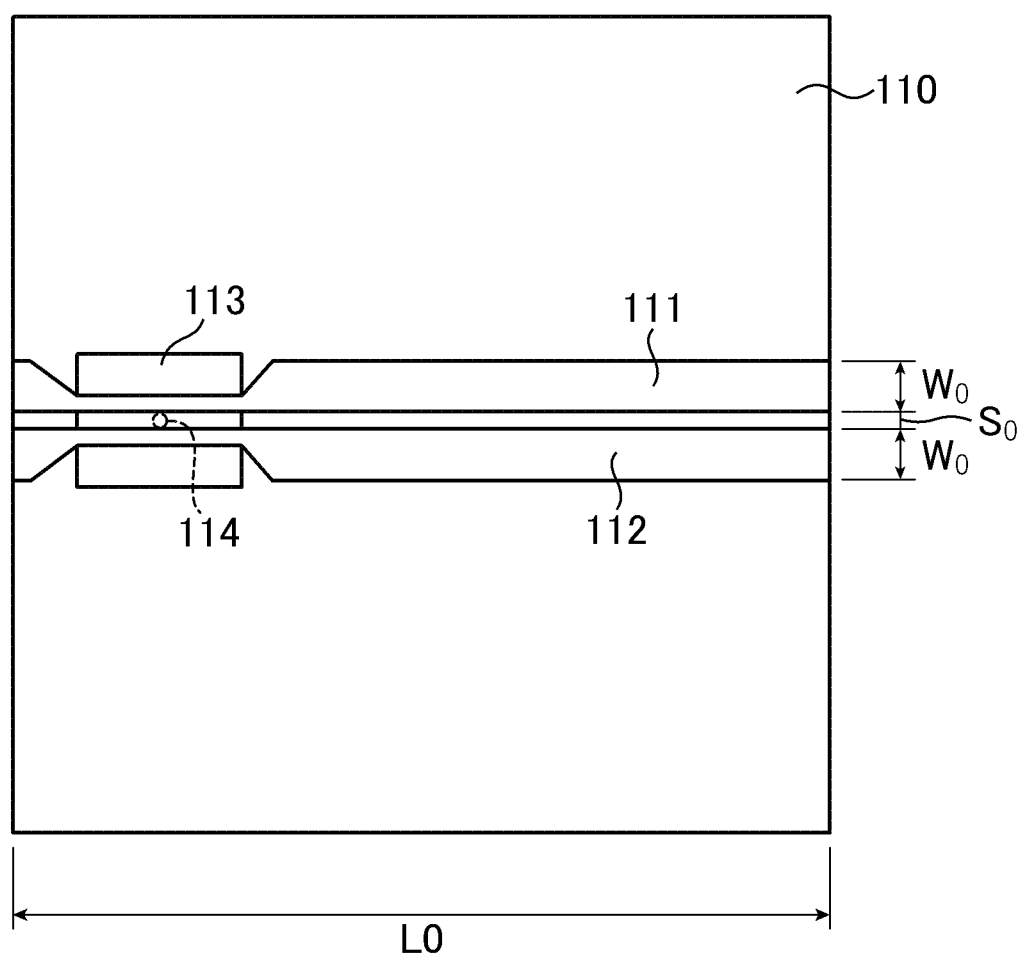
FIG. 10 is a top view illustrating a differential transmission line according to a second embodiment of the invention.

FIG. 10 is a top view illustrating the differential transmission line 6 according to this embodiment. As in FIG. 3, the differential transmission line 6 includes a first strip conductor 111, a second strip conductor 112, an intermediate conductive film 113, a via hole 114, and a grounded conductive layer 110. An example of the dimensions of each portion of the differential transmission line 6 will be described below according to the embodiment. A space S0 between a pair of transmission line conductors is 0.16 mm and a line length L0 of the differential transmission line 6 is 14 mm. A first width (width W0) which is the width of each of the pair of transmission line conductors is 0.975 mm in the straight-line region so that 50$\Omega$ can be obtained as the characteristic impedance Zdiff in the differential mode, and a second width (width WF) which is the width of each of the pair of transmission line conductors is 0.25 mm in the band rejection filter region. The second width is narrower than the first width. Further, the intermediate conductive film 113 has a rectangular shape with a width (in the vertical direction in the drawing) of 2.5 mm and a length (in the horizontal direction in the drawing) of 3.0 mm so that the resonant frequency is near 10.5 GHz, and the via hole 114 with a diameter of 0.2 mm is disposed in the middle of the intermediate conductive film 113. A distance Lvia between the connection pads and the center of the via hole 114 is 2.5 mm. The distance Lvia is a length that corresponds to 0.15×$\lambda$g at the frequency of 9.95 GHz and 0.17×$\lambda$g at the frequency of 11.3 GHz for a propagation wavelength kg in the differential transmission line.

Figure 11:
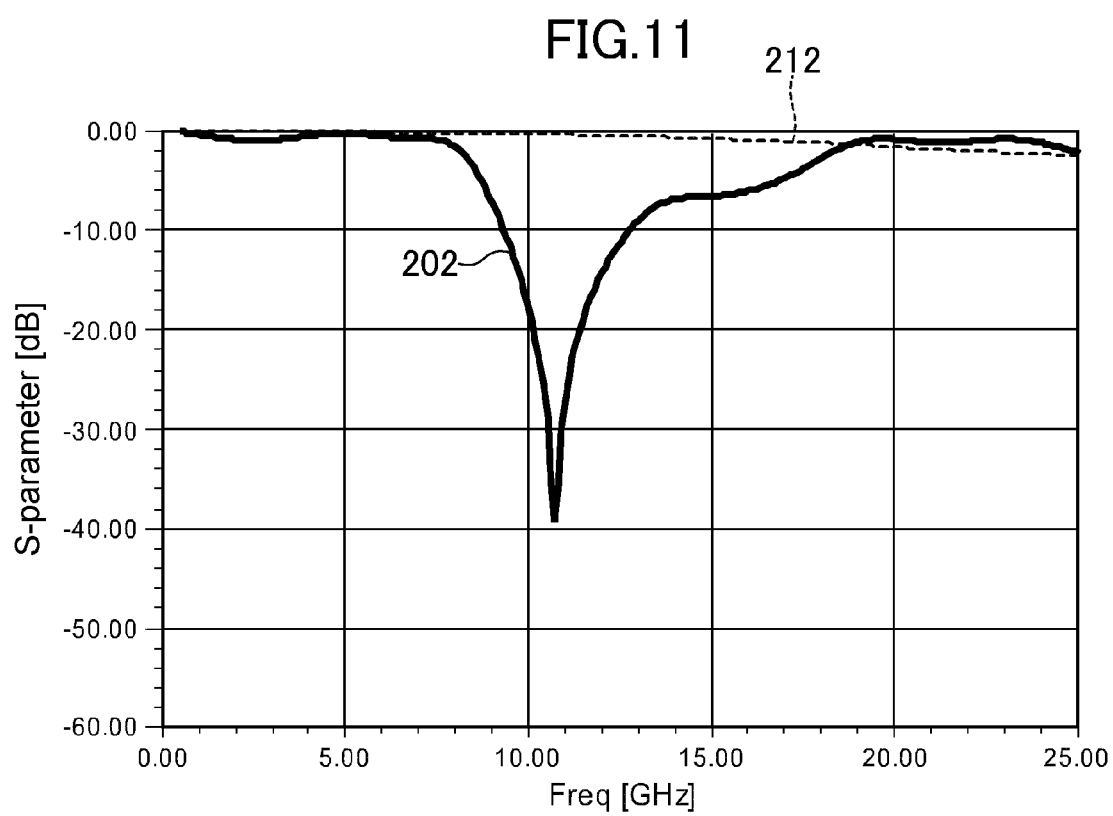
FIG. 11 is a diagram illustrating an analysis result of the differential transmission line according to the second embodiment of the invention.

FIG. 11 is a diagram illustrating an analysis result of the differential transmission line 6 according to this embodiment. As in FIG. 5, the analysis result is a result obtained by analyzing the configuration of the differential transmission line 6 by a three-dimensional electromagnetic field structure analysis tool. FIG. 11 shows a frequency dependency of insertion loss in common-mode Scc21) and insertion loss in differential-mode (Sdd21). In the drawing, the frequency dependencies are shown as a common mode 202 and a differential mode 212. Here, a reference impedance is set to 50$\Omega$ for the differential mode and is set to 12.5$\Omega$ for the common mode to perform the analysis.

In the differential mode 212, as shown in FIG. 11, good characteristics are obtained in that the loss is small in the frequency region shown in the drawing. On the other hand, in the common mode 202, a deep dip of −39 dB is shown at the frequency of 10.7 GHz, and thus the steep characteristics of the band rejection filter circuit in which the central frequency is 10.7 GHz can be obtained. Accordingly, when an electric output signal transmitted from the driving integrated circuit 1 with the differential output impedance of 50$\Omega$ at the bit rate of 10 Gbit/s, more specifically, at one bit rate in the range of 9.95 Gbit/s to 11.3 Gbit/s is in the information processing system 100 according to this embodiment, conduction propagation in the differential transmission line 6 is inhibited in the common mode of a frequency (a frequency of 9.95 GHz to 11.3 GHz) corresponding to the bit rate in spite of the fact that a common mode noise is contained in the differential transmission signal output by the driving integrated circuit 1. Thus, the reduction in the unintentional electromagnetic radiation and the securement of signal integrity are compatible.

According to this embodiment, the distance Lvia between the connection pads and the center of the via hole 114 is set to 2.5 mm. However, the value of the distance Lvia may be changed in the range of 5.6 mm or less, since the central frequency of the common mode band rejection filter circuit is set to 10.7 GHz and 10 GHz or more.

Third Embodiment

The basic configuration of the information processing system 100 according to a third embodiment of the invention is the same as that of the information processing system 100 according to the first embodiment. However, a differential transmission line 6 according to this embodiment is different from the differential transmission line according to the first embodiment in that the differential transmission line 6 includes two band rejection filter regions arranged in series.

Figure 12:
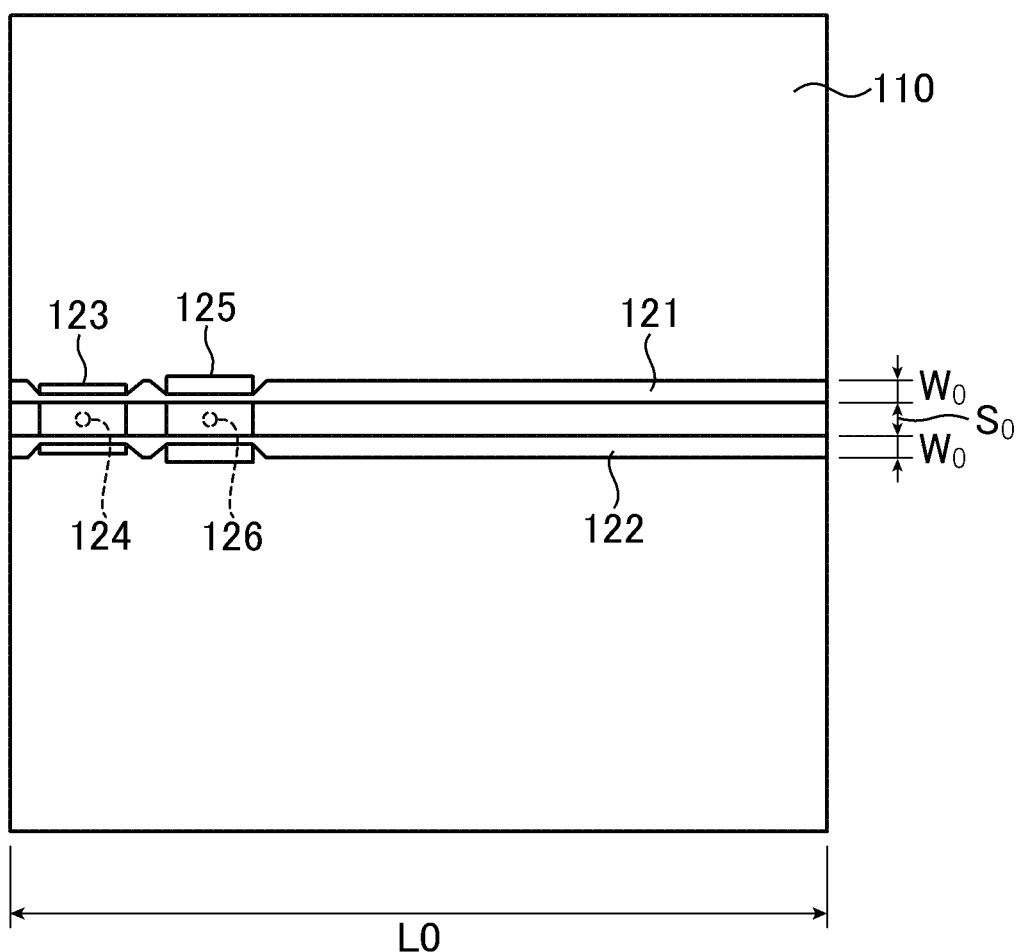
FIG. 12 is a top view illustrating a differential transmission line according to a third embodiment of the invention.

FIG. 12 is a top view illustrating the differential transmission line 6 according to this embodiment. The differential transmission line 6 includes a first strip conductor 121, a second strip conductor 122, a first intermediate conductive film 123, a second intermediate conductive film 125, a first via hole 124, and a second via hole 126. Here, two band rejection filter regions are referred to as first and second band rejection filter regions, when viewed from the side (left side) of the connection pads.

An example of the dimensions of each portion of the differential transmission line 6 will be described below according to the embodiment. A space S0 between a pair of transmission line conductors is 0.495 mm and a line length L0 of the differential transmission line 6 is 14 mm. A first width (width W0) which is the width of each of the pair of transmission line conductors is 0.39 mm in the straight-line region so that 100Ω can be obtained as the characteristic impedance Zdiff in the differential mode. A second width (width WF) which is the width of each of the pair of transmission line conductors is 0.1 mm in the first band rejection filter region. The second width is narrower than the first width. Likewise, a third width (width WG) which is the width of each of the pair of the transmission line conductors is 0.1 mm in the second band rejection filter region. The third width is narrower than the first width. The resonant frequencies of the resonant circuits in the first and second band rejection filter regions are preferably near one of the frequencies which are a natural number multiple of the frequency corresponding to the bit rate at which the driving integrated circuit 1 performs driving. Further, the frequencies which are a natural number multiple of the frequency corresponding to the bit rate are preferably different from each other in the first and second band rejection filter regions.

Here, the second intermediate conductive film 125 has a rectangular shape of 1.5 mm by 1.5 mm so that the resonant frequency of the resonant circuit formed in the second band rejection filter region is near 21 GHz, and the second via hole 126 with a diameter of 0.2 mm is disposed in the middle of the second intermediate conductive film 125. The first intermediate conductive film 123 has a rectangular shape with a width of 1.2 mm and a length of 1.5 mm so that the resonant frequency of the resonant circuit formed in the first band rejection filter region is near 22.5 GHz, and the first via hole 124 with a diameter of 0.2 mm is disposed in the middle of the first intermediate conductive film 123. As in the first embodiment, both the centers of the first via hole 124 and the second via hole 126 are on the central line of the pair of transmission line conductors. Here, when a distance Lvia is the distance between the connection pads and the center of the first via hole 126, the distance Lvia is 1.25 mm. The distance Lvia is a length that corresponds to 0.15×λg at the frequency of 19.9 GHz and 0.17×λg at the frequency of 22.6 GHz for a propagation wavelength λg in the differential transmission line 6 and is less than λg/2. Further, the distance between the center of the first via hole 124 and the center of the second via hole 126 is 2.25 mm.

Figure 13:
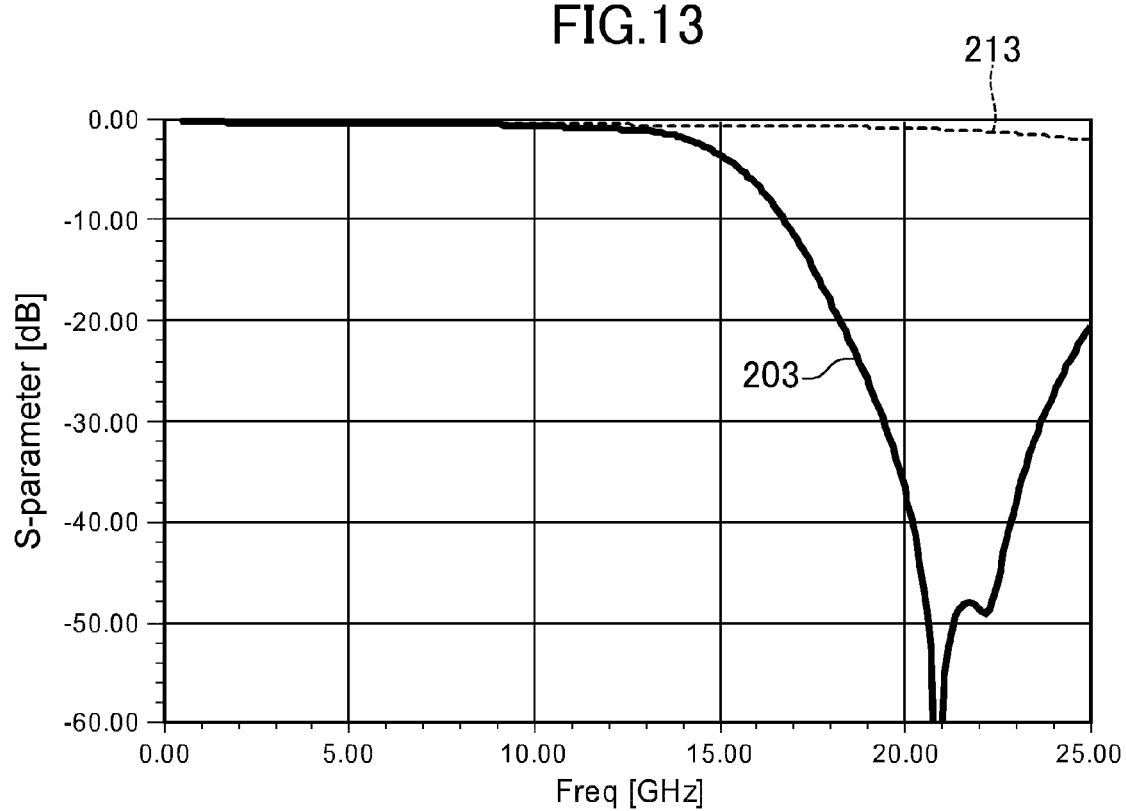
FIG. 13 is a diagram illustrating an analysis result of the differential transmission line according to the third embodiment of the invention.

FIG. 13 is a diagram illustrating an analysis result of the differential transmission line 6 according to this embodiment. As in FIG. 5, the analysis result is a result obtained by analyzing the configuration of the differential transmission line 6 by a three-dimensional electromagnetic field structure analysis tool. FIG. 13 shows a frequency dependency of insertion loss in common-mode (Scc21) and insertion loss in differential-mode (Sdd21). In the drawing, the frequency dependencies are shown as a common mode 203 and a differential mode 213. Here, a reference impedance is set to 100Ω for the differential mode and is set to 25Ω for the common mode to perform the analysis.

In the differential mode 213, as shown in FIG. 13, good characteristics are obtained in that the loss is small in the frequency region shown in the drawing. On the other hand, in the common mode 203, a deep dip having troughs is shown at the frequencies of 21 GHz and 22.5 GHz, and thus the stronger characteristics of the band rejection filter circuit of −35 dB or less can be obtained in the frequency range of 19.9 GHz to 22.6 GHz. Accordingly, when an electric output signal is transmitted from the driving integrated circuit 1 with the differential output impedance of 100Ω at the bit rate of 10 Gbit/s, more specifically, at one bit rate in the range of 9.95 Gbit/s to 11.3 Gbit/s the information processing system 100 according to this embodiment, conduction propagation in the differential transmission line is more strongly inhibited in the common mode of a double frequency component (a frequency of 19.9 GHz to 22.6 GHz) of the frequency corresponding to the bit rate in spite of the fact that a common mode noise is contained in the differential transmission signal output by the driving integrated circuit 1.

Fourth Embodiment

An information processing system 100 according to a fourth embodiment of the invention is an information processing system called an optical transceiver which transmits serial data as an optical signal to an optical fiber transmission line. The main configuration of the information processing system 100 according to this embodiment is an information processing system that includes an optical transmitter module 42 instead of the receiver circuit 4 and an optical receiver module instead of the transmitter circuit 5 in the information processing system 100 according to the first embodiment in FIG. 1.

Figure 14:
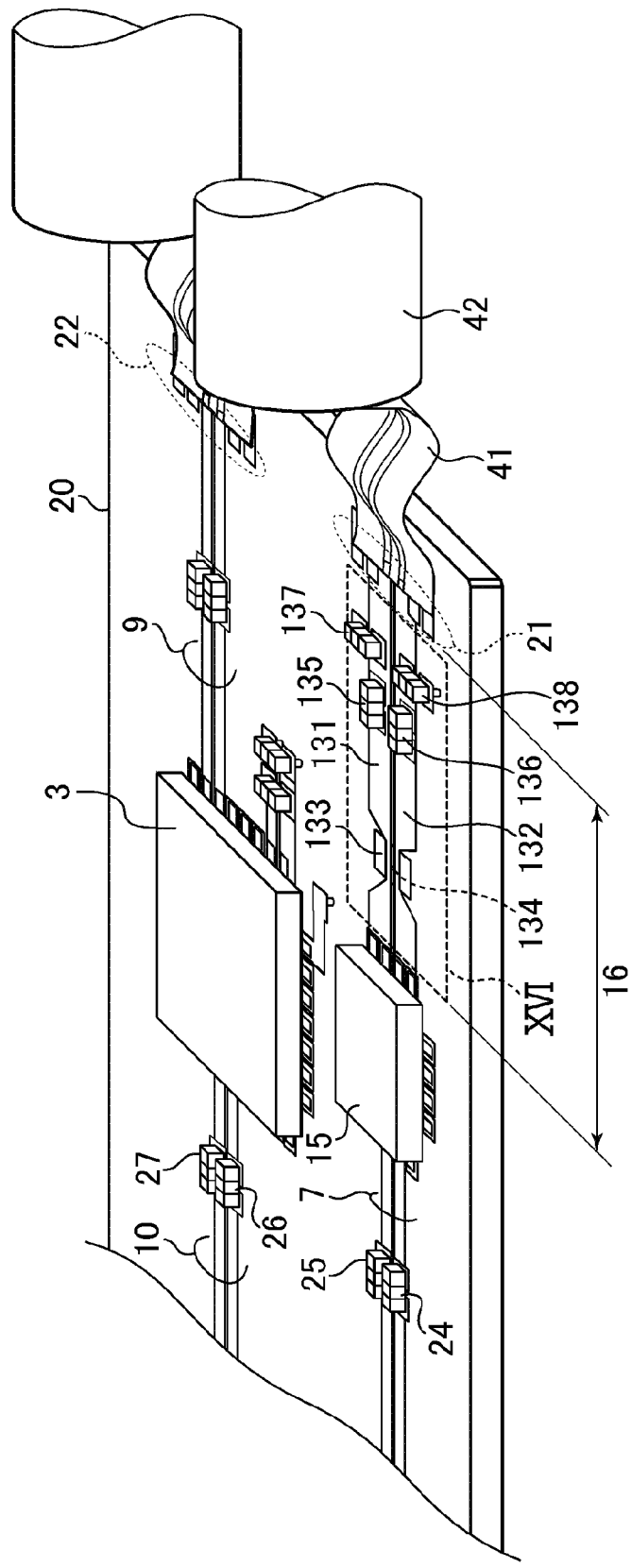
FIG. 14 is a perspective view illustrating the vicinity of a differential transmission line of an information processing system according to a fourth embodiment of the invention.

FIG. 14 is a perspective view illustrating the vicinity of a differential transmission line 16 of the information processing system 100 according to this embodiment. As in FIG. 2, FIG. 14 shows an electronic circuit portion that transmits an electric signal which is the serial data of the information processing system 100. A driving integrated circuit 15, the differential transmission line 16, and the like are disposed on a printed circuit substrate 20.

As shown in FIG. 14, as in FIG. 2, one ends (left ends) of a pair of transmission line conductors of the differential transmission line 16 is respectively connected to a pair of connection pads and is solder-connected to a pair of transmitter-side differential output terminals of the driving integrated circuit 15 in the connection pads. Further, the other ends (right ends) of the pair of transmission line conductors are connected to FPC connection terminals 21 and the output side of the differential transmission line 16 is electrically connected to a differential input terminal of the optical transmitter module 42 via an FPC 41.

The driving integrated circuit 15 amplifies an electric output signal input via a transmitter-side differential output transmission line 7 and outputs the amplified electric output signal to the differential transmission line 16. Here, the differential output impedance of the driving integrated circuit 15 is preferably close to 50Ω. Further, the electric output signal is transmitted to the optical transmitter module 42 via the differential transmission line on the FPC 41 connected to the FPC connection terminals 21. The optical transmitter module 42 is electrically driven by the input electric output signal. As in the differential transmission line 6 according to the first embodiment, the differential transmission line 16 includes a grounded conductive layer 110 (not shown), a first strip conductor 131 and a second strip conductor 132, which are a pair of transmission line conductors, an intermediate conductive film 133, and a via hole 134.

Further, DC-cut capacitors 135 and 136 are installed in the first strip conductor 131 and the second strip conductor 132 of the differential transmission line 16, respectively. For example, the DC-cut capacitors 135 and 136 are surface-mount type capacitors with a 1005 size of capacitance value of 0.1 μF. Choke inductors 137 and 138 are installed in the first strip conductor 131 and the second strip conductor 132, respectively.

The optical transmitter module 42 converts the electric signal into an optical signal and transmits the serial data as an optical signal to the optical fiber transmission line. For example, a direct modulation type semiconductor laser diode is mounted as an optical modulator in the optical transmitter module 42. A DC bias current is supplied to the semiconductor laser diode via the choke inductors 137 and 138.

Figure 15:
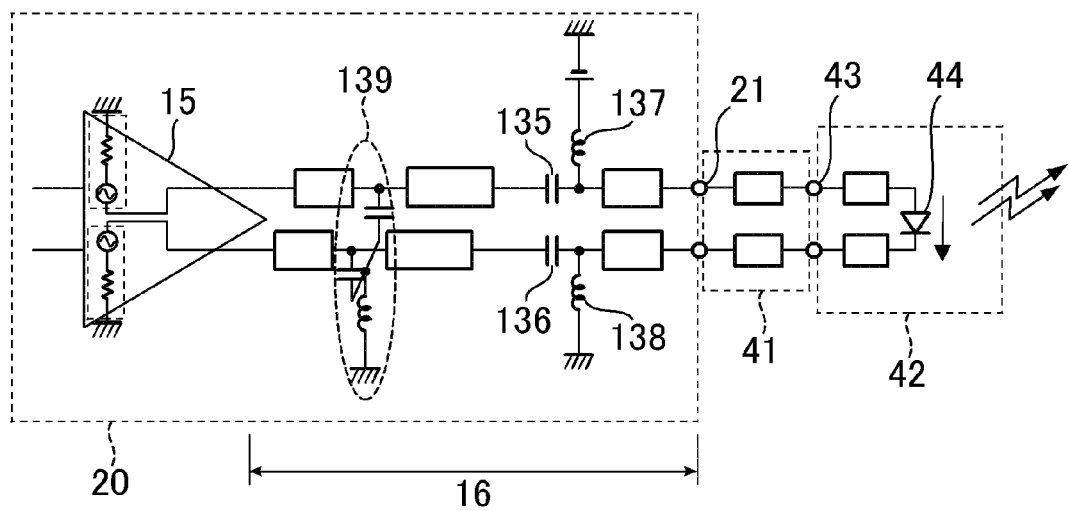
FIG. 15 is a circuit diagram illustrating a transmitter block of the information processing system according to the fourth embodiment of the invention.

FIG. 15 is a circuit diagram illustrating a transmitter block of the information processing system 100 according to this embodiment. One end (left end) of the differential transmission line 16 is connected to differential output terminals of the driving integrated circuit 15, the other end (right end) of the differential transmission line 16 is connected to the FPC connection terminals 21, and the differential transmission line 16 is connected to differential input terminals 43 of the optical transmitter module 42 via the differential transmission line on the FPC 41. Here, when the other end (output side) of the differential transmission line 16 is electrically connected to the differential input terminals of the optical transmitter module 42, the differential transmission line 16 and the differential input terminals 43 may be directly connected to each other or may be connected to each other via the differential transmission line on the FPC 41. Further, both ends of the differential input terminals 43 inside the optical transmitter module 42 are connected to both ends (anode and cathode terminals) of the semiconductor laser diodes 44. In the optical transmitter module 42, a serial resistant component of the semiconductor laser diode 44 operates as a termination load for a differential mode operation of a differential input. A current Idiode of the semiconductor laser diode 44 is modulated to generate an optical modulation signal. On the other hand, the semiconductor laser diode 44 is an open end for the common mode operation of the differential input. In the common mode signal, the current Idiode of the semiconductor laser diode 44 is not modulated. When the common mode noise of the differential output signal of the driving integrated circuit 15 reaches the differential input terminal 43 of the optical transmitter module 42, the common mode noise does not affect the optically modulated signal. However, the common mode signal component is totally reflected at the position of the semiconductor laser diode 44 to be transmitted through the differential transmission line on the FPC 41 and further transmitted through the differential transmission line 16. In this case, unnecessary electromagnetic radiation may easily occur. Therefore, when an element (for example, the optical transmitter module 42 or the semiconductor laser diode 44) which is an open end for the differential mode operation of the differential input is connected to both terminals of the output side of the differential transmission line, the advantages of the invention are further achieved. In FIG. 15, the resonant circuit 139 forming the common mode band rejection filter circuit has hitherto been described as an LC, or a lumped element circuit. However, the lumped element (LC) circuit is not an accurately described circuit, but is a conceptually described circuit.

Figure 16:
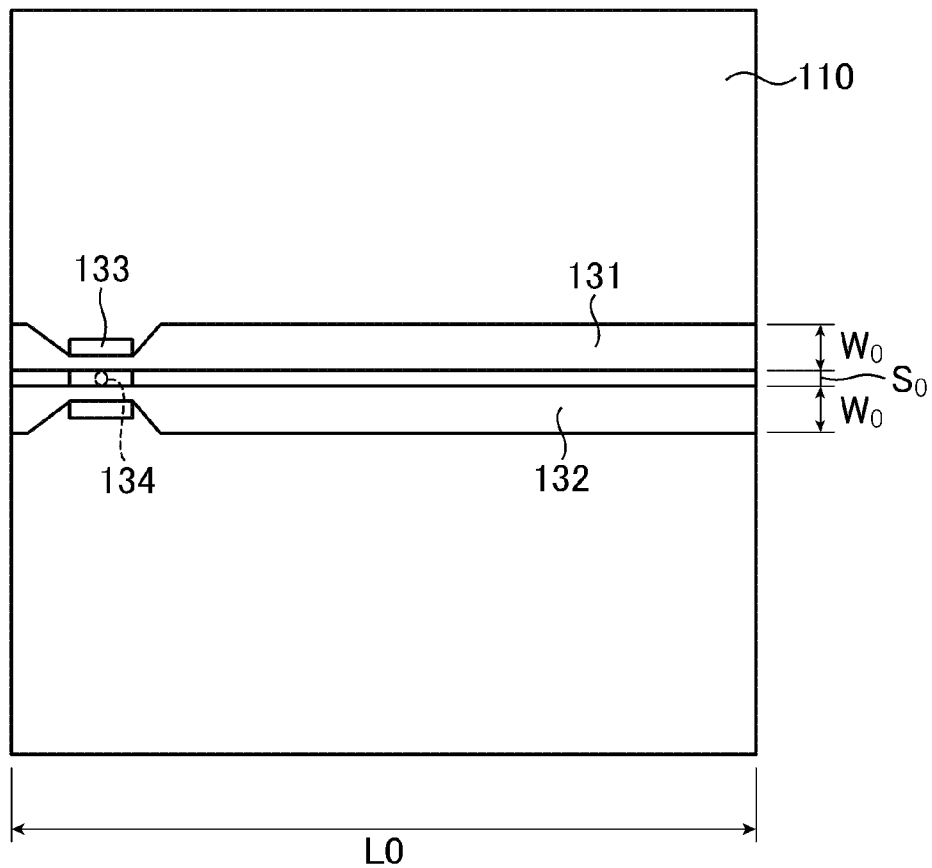
FIG. 16 is a top view illustrating a differential transmission line according to the fourth embodiment of the invention.

FIG. 16 is a top view illustrating the differential transmission line 16 according to this embodiment. As in FIG. 3, the differential transmission line 16 includes the first strip conductor 131, the second strip conductor 132, the intermediate conductive film 133, the via hole 134, and the grounded conductive layer 110. To facilitate the description, the DC-cut capacitors 135 and 136 and the choke inductors 137 and 138 are not illustrated in the differential transmission line 16 shown in FIG. 16. An example of the dimensions of each portion of the differential transmission line 16 will be described below according to the embodiment. A space S0 between the pair of transmission line conductors is 0.16 mm and a line length L0 of the differential transmission line 16 is 14 mm. A first width (width W0) which is the width of each of the pair of transmission line conductors is 0.975 mm in the straight-line region so that 50Ω can be obtained as the characteristic impedance Zdiff in the differential mode, and a second width (width WF) which is the width of each of the pair of transmission line conductors is 0.25 mm in the band rejection filter region. The second width is narrower than the first width. Further, the intermediate conductive film 133 has a rectangular shape with a width of 1.5 mm and a length (in the horizontal direction in the drawing) of 1.25 mm so that the resonant frequency is near 21 GHz, and the via hole 134 with a diameter of 0.2 mm is disposed in the middle of the intermediate conductive film 133. A distance Lvia between the connection pads and the center of the via hole 134 is 1.6 mm. The distance Lvia is a length that corresponds to 0.19×λg at the frequency of 19.9 GHz and 0.22×λg at the frequency of 22.6 GHz for a propagation wavelength λg in the differential transmission line.

Figure 17:
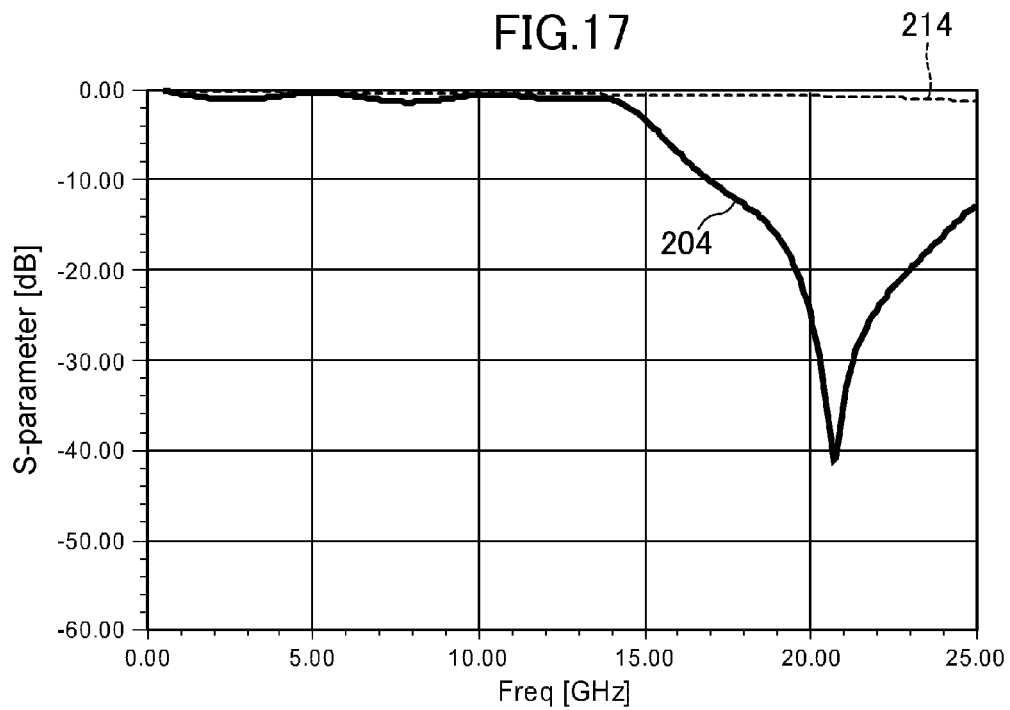
FIG. 17 is a diagram illustrating an analysis result of the differential transmission line according to the fourth embodiment of the invention.

FIG. 17 is a diagram illustrating an analysis result of the differential transmission line 16 according to this embodiment. As in FIG. 5, the analysis result is a result obtained by analyzing the configuration of the differential transmission line 16 by a three-dimensional electromagnetic field structure analysis tool. FIG. 17 shows a frequency dependency of insertion loss in common-mode (Scc21) and insertion loss in differential-mode (Sdd21). In the drawing, the frequency dependencies are shown as a common mode 204 and a differential mode 214. Here, a reference impedance is set to 50Ω for the differential mode and is set to 12.5Ω for the common mode to perform the analysis.

In the differential mode 214, as shown in FIG. 17, good characteristics are obtained in that the loss is small in the frequency region shown in the drawing. On the other hand, in the common mode 204, a deep dip of −41 dB is shown at the frequency of 20.7 GHz, and thus the steep characteristics of the band rejection filter circuit in which the central frequency is 20.7 GHz can be obtained.

Figure 18:
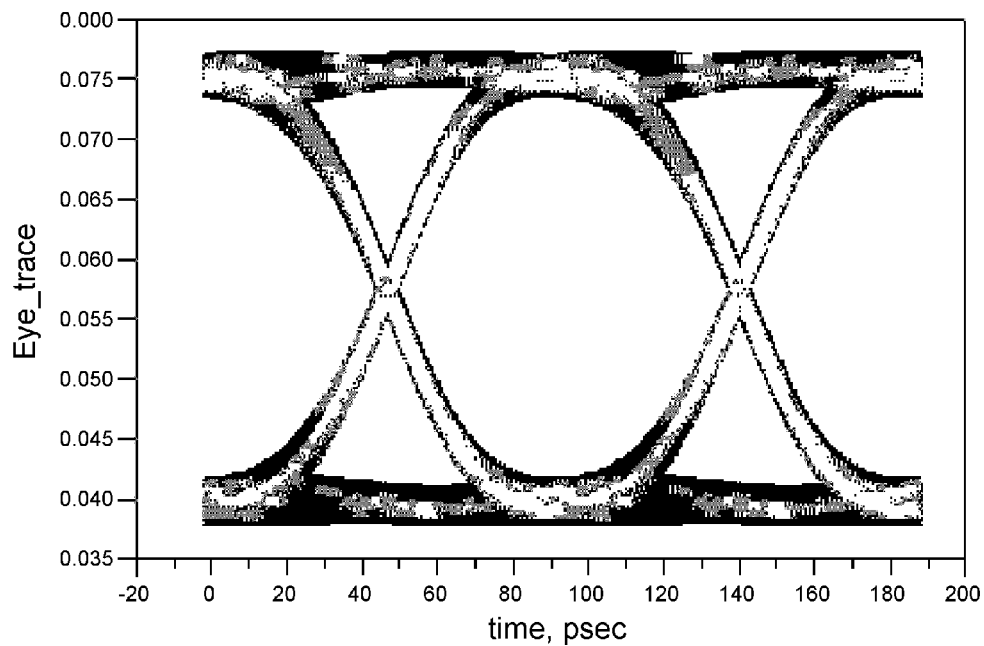
FIG. 18 is a diagram illustrating a current waveform of a semiconductor laser diode of the information processing system according to the fourth embodiment of the invention.

FIG. 18 is a diagram illustrating a current waveform in the semiconductor laser diode 44 of the information processing system 100 according to this embodiment. The current waveform in the semiconductor laser diode 44 is obtained by obtaining the small signal characteristics of the information processing system 100 by a three-dimensional electromagnetic field structure analysis tool and calculating the current waveform by a circuit simulation based on the small signal characteristics. As shown in FIG. 18, an eye diagram with a small jitter and a high aperture degree can be obtained.

Figure 26:
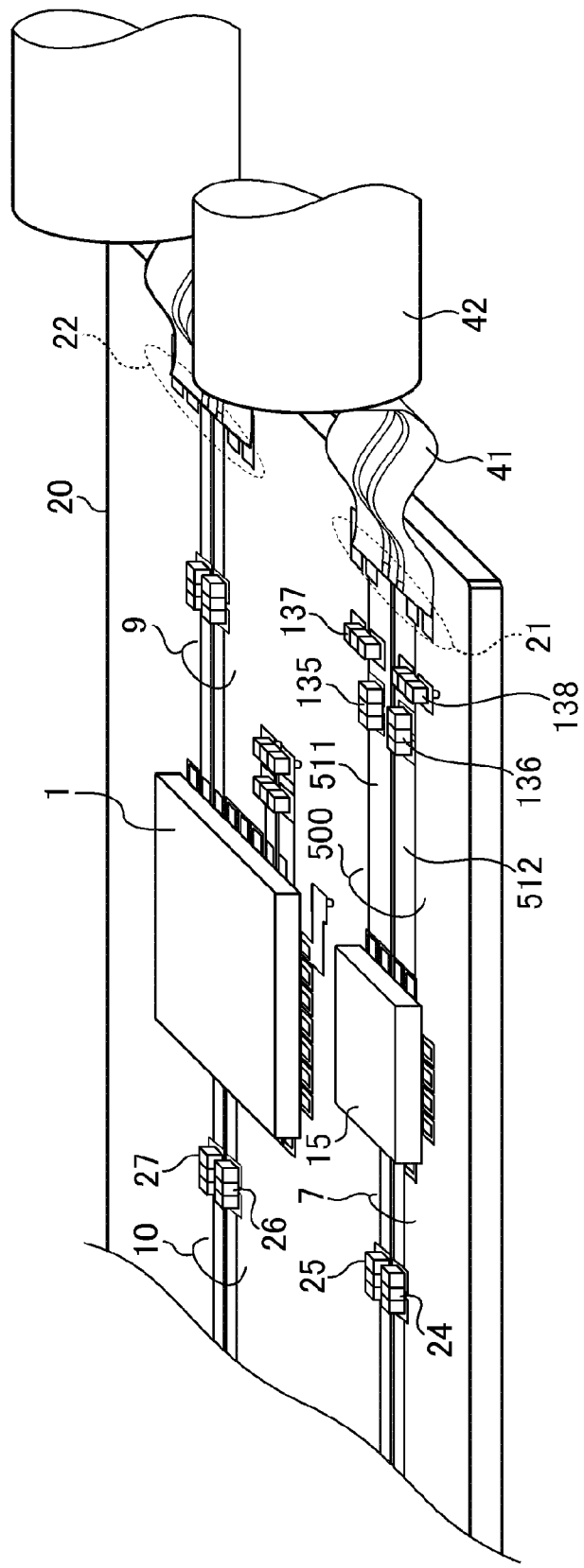
FIG. 26 is a perspective view illustrating the vicinity of a differential transmission line of an information processing system according to a second example of the related art which is a comparative example of the fourth embodiment of the invention.

FIG. 26 is a perspective view illustrating the vicinity of a differential transmission line 500 of an information processing system according to a second example of the related art which is a comparative example of this embodiment. The differential transmission line 500 according to the second example of the related art in FIG. 26 is different from the differential transmission line 16 according to this embodiment in that a first strip conductor 511 and a second strip conductor 512, which are a pair of transmission line conductors, each have a first width (width W0) in all of the regions, the differential transmission line 500 does not include the intermediate conductive film 133 and the via hole 134, and there is no band rejection filter region. The other configuration is the same as the configuration of this embodiment.

The maximum electric field intensities E from the electromagnetic radiation are calculated for the information processing system 100 according to this embodiment and the information processing system according to the second example of the related art. The comparison result is shown in Table 1 below.

TABLE 1

| FREQUENCY | SECOND EXAMPLE OF RELATED ART | FOURTH EMBODIMENT |
|---|---|---|
| 19.9 GHz | 106 dB (μV/m) | 85 dB (μV/m) |
| 20.6 GHz | 99 dB (μV/m) | 80 dB (μV/m) |
| 22.6 GHz | 100 dB (μV/m) | 82 dB (μV/m) |

When the maximum electric field intensities E are calculated, the common mode output impedance and the output voltage of the driving integrated circuit 15 obtained using a three-dimensional electromagnetic field structure analysis tool are assumed to be 12.5Ω and 1 V, respectively. When the representative frequencies f are 19.9 GHz, 20.6 GHz, and 22.6 GHz, the maximum electric field intensities E are calculated at an observation position at which a distance D up to an observation point is 3 m. As shown in Table 1, the information processing system 100 according to this embodiment can obtain the advantage of considerably suppressing the maximum electric field intensities E by 18 dB to 21 dB, compared to the second example of the related art.

Accordingly, even in a case where the optical transmitter module 42 which is the open end for the common node operation of the differential input is used, when an electric output signal is transmitted at the bit rate of 10 Gbit/s, more specifically, at one bit rate in the range of 9.95 Gbit/s to 11.3 Gbit/s, in the information processing system 100 according to this embodiment, conduction propagation of the double frequency component (a frequency of 19.9 GHz to 22.6 GHz) of a frequency corresponding to the bit rate in the differential transmission line 16 is inhibited in spite of the fact that a common mode noise is contained in the differential transmission signal output by the driving integrated circuit 1. Thus, the reduction in the unintentional electromagnetic radiation and the securement of signal integrity of the serial data in the optical fiber transmission are compatible.

In the information processing system 100 according to this embodiment, the distance Lvia is set to 1.6 mm. However, the value of the distance Lvia may be changed as long as the value is 0.35×λg or less in the frequency range (the range of 19.9 GHz to 20.6 GHz) corresponding to the common mode rejection filter circuit. Further, the value of the distance Lvia may be changed in the range of 2.8 mm or less.

In the information processing system 100 according to this embodiment, the differential transmission line 16 has the configuration shown in FIG. 16, but the invention is not limited thereto. For example, the differential transmission line 16 may have the configuration of the differential transmission line 6 described in FIG. 10 in the second embodiment. In this case, even when the optical transmitter module 42 which is the open end for the common mode operation of the differential input is applied, the conduction propagation of the frequency component (in the range of 9.95 GHz to 11.3 GHz) corresponding to the bit rate through the differential transmission line is inhibited. Thus, the reduction in the unintentional electromagnetic radiation and the securement of signal integrity of the serial data in the optical fiber transmission are compatible.

A optical transceiver, which is designed to achieve high speed, miniaturization, and low lost and operates at a bit rate of 10 Gbit/s to realize high speed as the recent broadband network has spread, has currently come into wide use as the optical transceiver (optical transceiver module) for optical fiber transmission. As for the miniaturization and low cost, the standard of the earlier generation 300 pin MSA (Multi Source Agreement) has been changed to XENPAK, X2, XFP, SFP+ (each MSA standard) to reduce the volume of a case and the number of components. On the other hand, in an information processing system on which the optical transceiver is mounted, the intensity of the unintentional electromagnetic radiation caused in the information processing system has to be suppressed to a value equal to or less than the limit value determined in the law. For example, in the United States, the intensity of the unintentional electromagnetic radiation has to satisfy a value equal to or less than the limit value of 53.9 dB (μV/m) (a case of the Class B standard, a distance of 3 m, and a frequency range of 1 GHz to 40 GHz) determined in the FCC Part 15 Subpart B standard. When the invention is applied to the optical transceiver, it is possible to reduce the unintentional electromagnetic radiation of a high frequency caused due to a switching noise of an internal IC of the optical transceiver toward the outside of the system, thereby obtaining the advantages of the invention.

Fifth Embodiment

The basic configuration of an information processing system 100 according to a fifth embodiment of the invention is the same as that of the information processing system 100 according to the fourth embodiment, but the configuration of the differential transmission line 17 according to the fifth embodiment is different from that of the differential transmission line according to the fourth embodiment. One of a pair of transmission line conductors of the differential transmission line 17 is connected to a single-end input terminal of an optical transmitter module 42 via the FPC 41 and the other of the pair of transmission line conductors is connected to a termination resistor 147.

Figure 19:
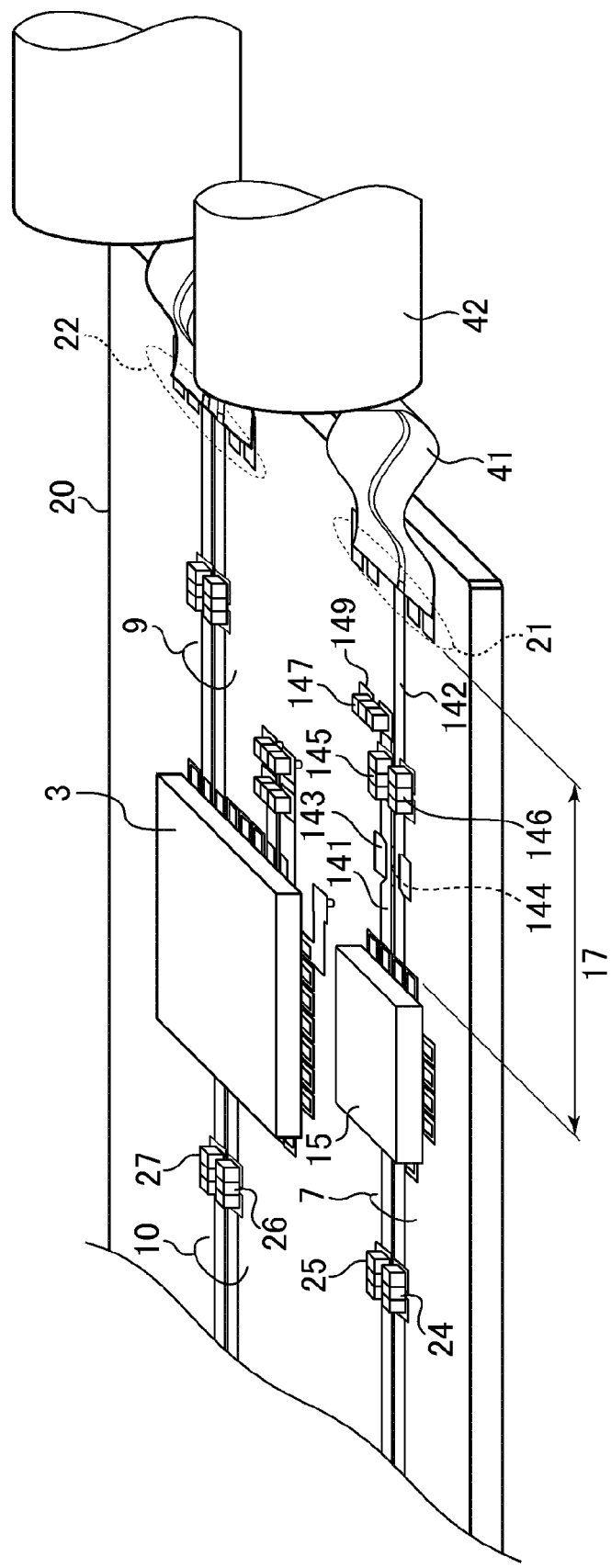
FIG. 19 is a perspective view illustrating the vicinity of a differential transmission line of an information processing system according to a fifth embodiment of the invention.

FIG. 19 is a perspective view illustrating the vicinity of the differential transmission line 17 of the information processing system 100 according to this embodiment. As in FIG. 2, FIG. 19 shows an electronic circuit portion that transmits an electric signal which is the serial data of the information processing system 100. A driving integrated circuit 15, the differential transmission line 17, and the like are disposed on a printed circuit substrate 20.

The differential transmission line 17 includes a grounded conductive layer 110 (not shown), a first strip conductor 141 and a second strip conductor 142, which are a pair of transmission line conductors, an intermediate conductive film 143, and a via hole 144. Further, DC-cut capacitors 145 and 146 are installed in the first strip conductor 141 and the second strip conductor 142 of the differential transmission line 17, respectively. For example, the DC-cut capacitors 145 and 146 are surface-mount type capacitors with a 1005 size of capacitance value of 0.1 μF, but may be not installed, when unnecessary.

As shown in FIG. 19, the second strip conductor 142 is connected to a single-end input terminal of the optical transmitter module 42 via a single-end transmission line on an FPC 41 connected to FPC connection terminals 21. Here, when the output side (the other end) of the second strip conductor 142 is electrically connected to the single-end input terminal of the optical transmitter module 42, the second strip conductor may be directly connected to the single-end input terminal of the optical transmitter module 42 or may be connected to the single-end input terminal of the optical transmitter module 42 via a differential transmission line on the FPC 41. The first strip conductor 141 is connected to one end of the termination resistor 147. The other end of the termination resistor 147 is connected to a ground pad 149 so that the termination resistor 147 serves as a termination resistor. The termination resistor 147 is a surface-mount type resistor with a 1005 size of the resistant value of 50 Ω.

The single-end transmission line on the FPC 41 may be a transmission line of which the characteristic impedance is 50Ω. For example, a direct modulation type semiconductor laser diode is mounted as an optical modulator in the optical transmitter module 42. The single-end input impedance to the semiconductor laser diode is preferably near 50Ω. For example, a driver IC with the input impedance of 50Ω is disposed inside the optical transmitter module 42 so as to drive a semiconductor laser.

In the information processing system 100 according to this embodiment, the double frequency component (a frequency of 19.9 GHz to 22.6 GHz) of the frequency corresponding to the bit rate in the common mode is inhibited in the band rejection filter region, and thus conduction propagation to the farther single-end transmission line is inhibited in spite of the fact that a common mode noise is contained in the differential transmission signal output by the driving integrated circuit 15. Therefore, it is possible to obtain the advantage of reducing the unintentional electromagnetic radiation. The direct modulation type semiconductor laser diode is mounted as the optical modulator on the optical transmitter module 42 according to this embodiment, but an MZ (Mach-Zehnder) type optical modulator may be used. Farther optical fiber transmission can be realized in the farther region by the MZ type optical modulator.

Sixth Embodiment

The basic configuration of an information processing system 100 according to a sixth embodiment of the invention is the same as that of the information processing system 100 according to the first embodiment, but is different in that the information processing system 100 includes a shield lid 151 that covers the driving integrated circuit 1 and a part of the differential transmission line 6. The shield lid 151 is disposed to cover not only the driving integrated circuit 1 but also a region including a first straight-line region SL1 and a band rejection filter region FL in the differential transmission line 6 shown in FIG. 3.

Figure 20:
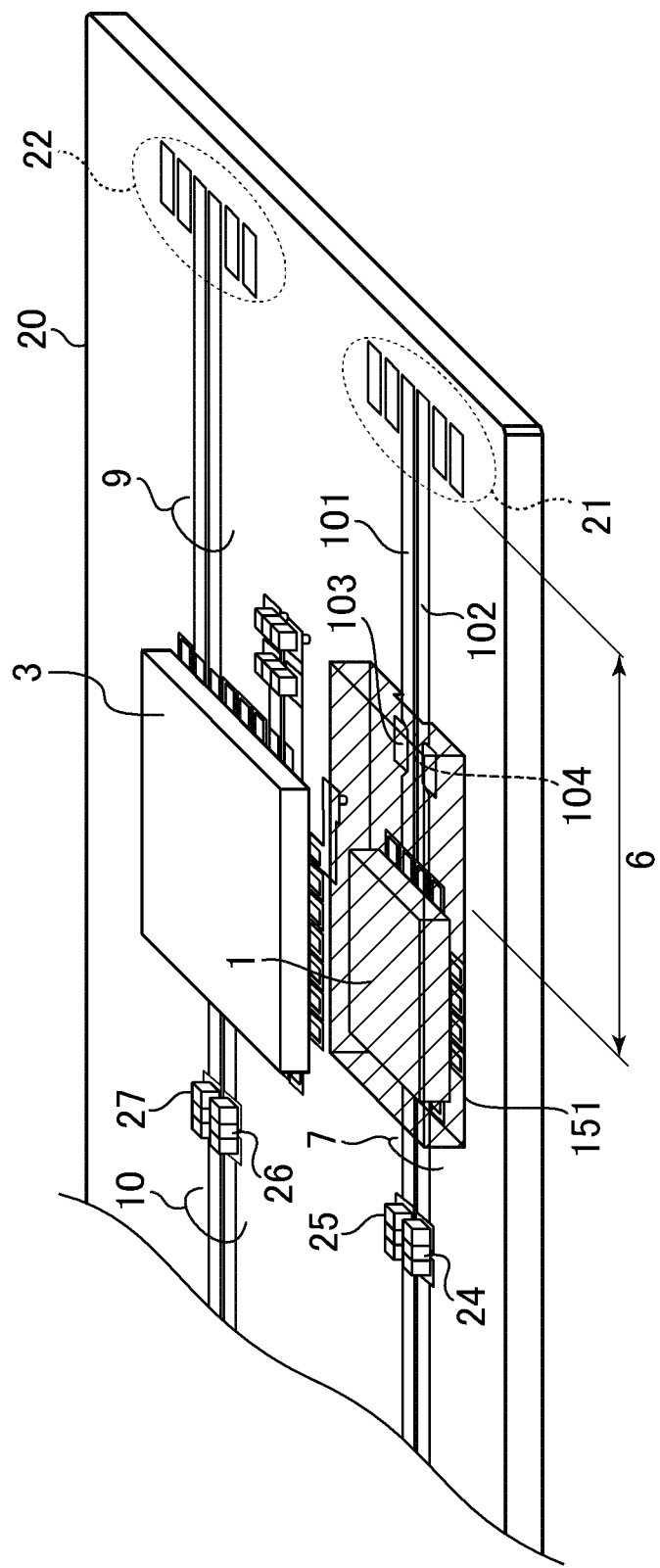
FIG. 20 is a perspective view illustrating the vicinity of a differential transmission line of an information processing system according to a sixth embodiment of the invention.
Figure 21:
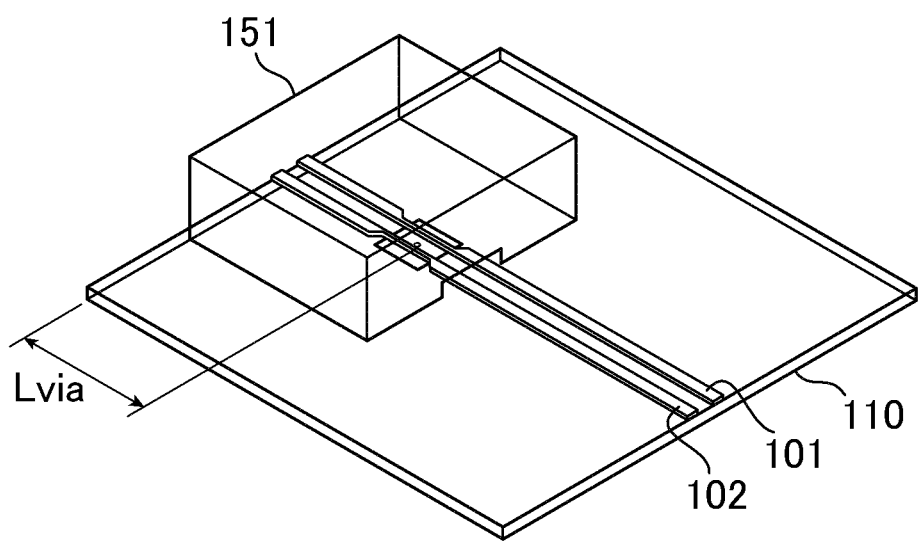
FIG. 21 is a schematic perspective view illustrating the vicinity of a differential transmission line of an information processing system according to the sixth embodiment of the invention.

FIG. 20 is a perspective view illustrating the vicinity of the differential transmission line 6 of the information processing system 100 according to this embodiment. FIG. 21 is a schematic perspective view illustrating the vicinity of the differential transmission line 6 of the information processing system 100 according to this embodiment. The shield lid 151 is formed by processing a plate. An electromagnetic wave absorber may be disposed between the shield lid 151 and the driving integrated circuit 1. The presence or absence of resonance and the resonant frequency depend on the size of the inside space of the shield lid 151. However, in some cases, it is possible to expect the advantage of reducing the cavity resonance occurring inside the shield lid 151 by disposing the electromagnetic wave absorber. A material having dielectric loss, resistive loss, and magnetic loss as an electromagnetic wave absorption mechanism may be selected as the material of the electromagnetic wave absorber. The shield lid 151 is preferably fixed to the ground potential and is connected to the grounded conductive layer 110 via the via hole (not shown).

The shield lid 151 shields the electromagnetic waves radiated to a space mainly from the first straight-line region SL1 and the band rejection filter region FL out of the regions of the driving integrated circuit 1 and the differential transmission line 6. When the distance Lvia between the connection pads and the center of the via hole 104 is set to a value close to an integral multiple of λg/2, as described above, a portion between the driving integrated circuit 1 and the band rejection filter region FL may be configured as a loop antenna. In the information processing system 100 according to the first embodiment, it is necessary to limit the range of the distance Lvia. In the differential transmission line 6 according to this embodiment, however, it is not necessary to limit the range of the distance Lvia. When the band rejection filter region FL is located inside the shield lid 151, the band rejection filter region FL can be disposed at any position, and thus the freedom of design can be added. In the differential transmission line 6 according to this embodiment, conduction propagation of the noise of the frequency corresponding to the common mode signal component through the differential transmission line 6 is inhibited in the farther region (second straight-line region SL2) by the band rejection filter region FL. Therefore, it is not necessary to cover the farther region with the shield lid 151 and the size of the shield lid 151 can be made to be small compared to the related art. Further, when the electromagnetic wave absorber is disposed inside the shield lid 151, the electromagnetic wave absorber can be miniaturized with a decrease in the size of the shield lid 151.

An example of the dimensions will be described below according to the embodiment. Here, the distance Lvia is 4.2 mm. The distance Lvia is a length that corresponds to 0.50×λg at the frequency of 19.9 GHz and 0.57×λg at the frequency of 22.6 GHz for a propagation wavelength λg in the differential transmission line. As shown in FIG. 6, the distance Lvia corresponds to a peak point of the maximum electric field intensity E at the frequency of 19.9 GHz. That is, the condition that a good loop antenna is formed is that the loop antenna is formed in a portion between the driving integrated circuit 1 and the band rejection filter region FL of the differential transmission line 6.

Figure 27:
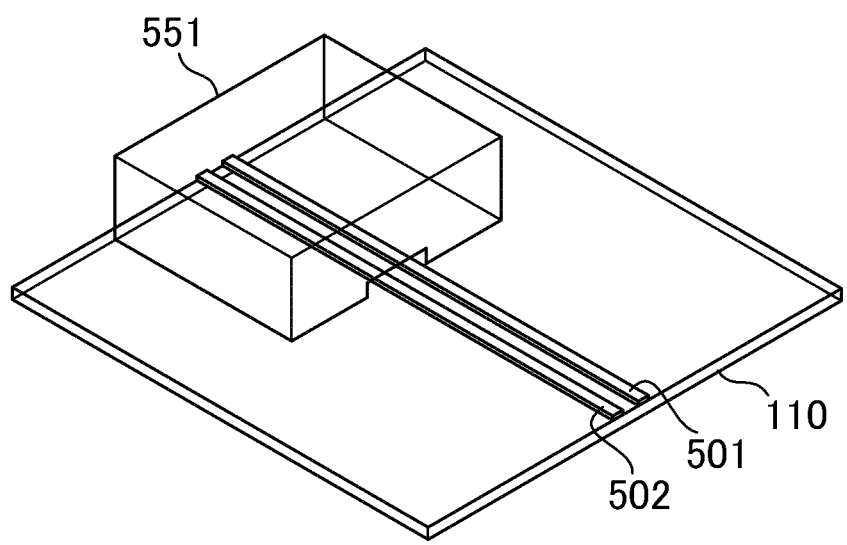
FIG. 27 is a schematic perspective view illustrating the vicinity of a differential transmission line of an information processing system according to a third example of the related art which is a comparative example of the sixth embodiment of the invention.

FIG. 27 is a schematic perspective view illustrating the vicinity of a differential transmission line of an information processing system according to a third example of the related art which is a comparative example of this embodiment. The differential transmission line shown in FIG. 27 is the same as the differential transmission line according to the first example of the related art in FIG. 25. A shield lid 551 covers the driving integrated circuit 1 (not shown) and a part of the differential transmission line.

The maximum electric field intensities E from the electromagnetic radiation are calculated for the information processing system 100 according to this embodiment and the information processing system according to the third example of the related art. The comparison result is shown in Table 2 below.

TABLE 2

| FREQUENCY | THIRD EXAMPLE OF RELATED ART | SIXTH EMBODIMENT |
|---|---|---|
| 19.9 GHz | 103 dB (μV/m) | 93 dB (μV/m) |
| 20.6 GHz | 103 dB (μV/m) | 81 dB (μV/m) |
| 22.6 GHz | 105 dB (μV/m) | 91 dB (μV/m) |

When the maximum electric field intensities E are calculated, the common mode output impedance and the output voltage of the driving integrated circuit 15 obtained using a three-dimensional electromagnetic field structure analysis tool are assumed to be 25Ω and 1 V, respectively. When the representative frequencies f are 19.9 GHz, 20.6 GHz, and 22.6 GHz, the maximum electric field intensities E are calculated at an observation position at which a distance D up to an observation point is 3 m. As shown in Table 2, the information processing system 100 according to this embodiment can obtain the advantage of considerably suppressing the maximum electric field intensities E by 10 dB to 22 dB, compared to the third example of the related art.

In the information processing system 100 according to this embodiment, the band rejection filter region of the differential transmission line 6 can be disposed at any position, and thus the freedom of design can be added. Further, the double frequency component (from 19.9 GHz to 22.6 GHz) of the frequency corresponding to the bit rate is inhibited in the band rejection filter region in spite of the fact that a common mode noise is contained in the differential transmission signal output by the driving integrated circuit 1, and thus the conduction propagation to the farther differential transmission line is suppressed. Therefore, it is possible to obtain the advantage of reducing the unintentional electromagnetic radiation.

Seventh Embodiment

The basic configuration of an information processing system 100 according to a seventh embodiment of the invention is the same as that of the information processing system 100 according to the fourth embodiment, but is different from the configuration according to the fourth embodiment in that a differential transmission line 18 according to the seven embodiment includes two band rejection filter regions arranged in series and a shield lid 152 is disposed to cover a driving integrated circuit 15 and the two band rejection filter regions of the differential transmission line 18.

Figure 22:
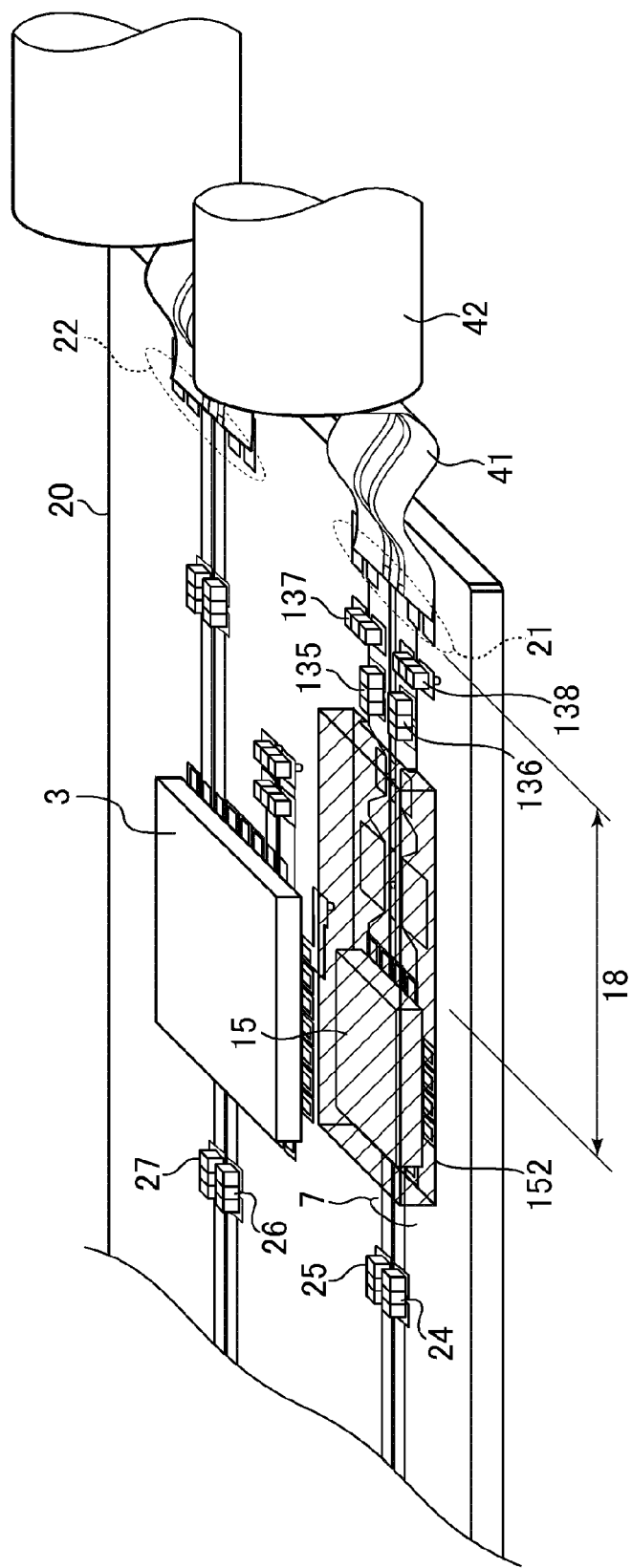
FIG. 22 is a perspective view illustrating the vicinity of a differential transmission line of an information processing system according to a seventh embodiment of the invention.

FIG. 22 is a perspective view illustrating the vicinity of the differential transmission line 18 of the information processing system 100 according to this embodiment. As described above, the shield lid 152 covers the driving integrated circuit 15 and a part of the differential transmission line 18.

Figure 23:
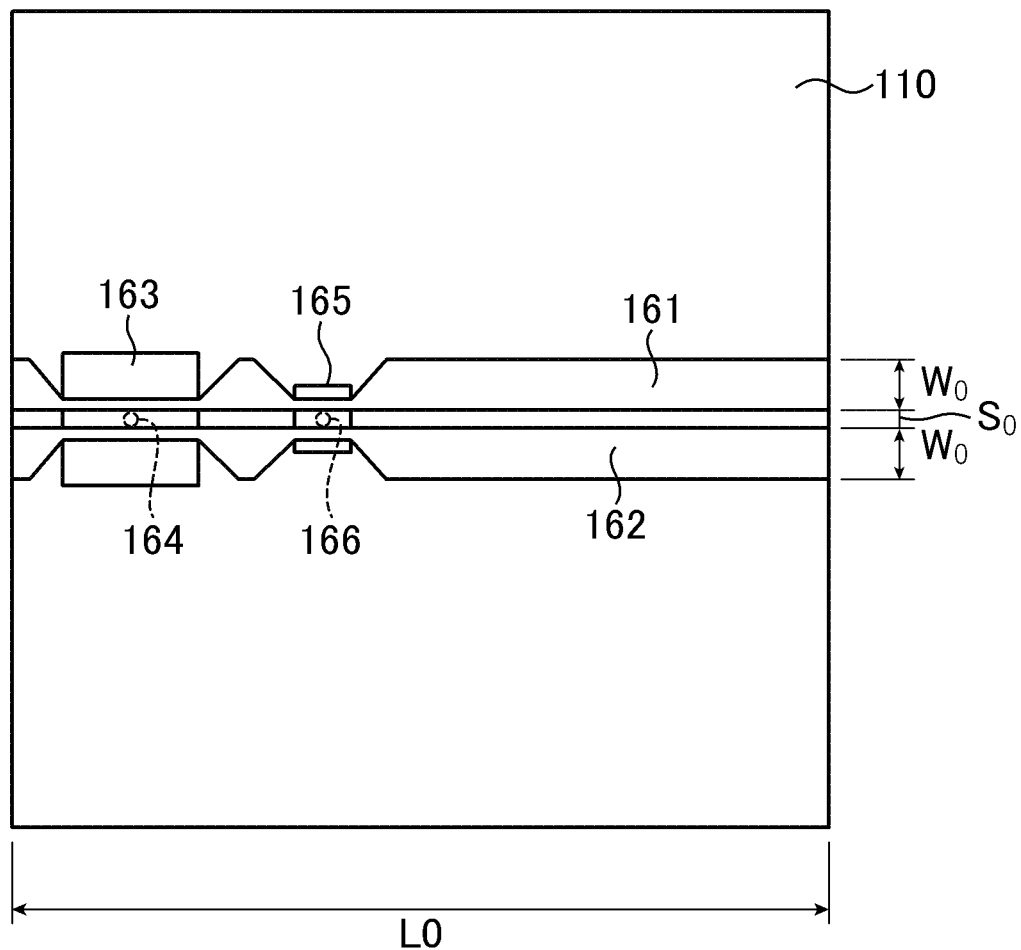
FIG. 23 is a top view illustrating a differential transmission line according to the seventh embodiment of the invention.

FIG. 23 is a top view illustrating the differential transmission line 18 according to this embodiment. The differential transmission line 18 includes a first strip conductor 161, a second strip conductor 162, a first intermediate conductive film 163, a second intermediate conductive film 165, a first via hole 164, and a second via hole 166. Here, two band rejection filter regions are referred to as the first and second band rejection filter regions, when viewed from the connection pads (left side). To facilitate the description, DC-cut capacitors 135 and 136 and choke inductors 137 and 138 are not illustrated in the differential transmission line 18 shown in FIG. 23.

An example of the dimensions of each portion of the differential transmission line 18 will be described below according to the embodiment. A space S0 between a pair of transmission line conductors is 0.16 mm and a line length L0 of the differential transmission line 18 is 14 mm. A first width (width W0) which is the width of each of the pair of transmission line conductors is 0.975 mm in the straight-line region so that 50Ω can be obtained as the characteristic impedance Zdiff in the differential mode. A second width (width WF) which is the width of each of the pair of transmission line conductors is 0.25 mm in the first band rejection filter region. The second width is narrower than the first width. Likewise, a third width (width WG) which is the width of each of the pair of transmission line conductors is 0.25 mm in the second band rejection filter region. The third width is narrower than the first width.

Here, the resonant frequency of a resonant circuit formed in the first band rejection filter region is set to be near the frequency corresponding to the bit rate of the serial data transmission output by the driving integrated circuit 15. The resonant frequency of a resonant circuit formed in the second band rejection filter region is set to be near the double frequency of the above frequency. The first intermediate conductive film 163 has a rectangular shape with a width of 2.5 mm and a length of 3.0 mm so that the resonant frequency of the resonant circuit formed in the first band rejection filter region is near 10.5 GHz, and the first via hole 164 with a diameter of 0.2 mm is disposed in the middle of the first intermediate conductive film 163. The second intermediate conductive film 165 has a rectangular shape with a width of 1.5 mm and a length of 1.25 mm so that the resonant frequency of the resonant circuit formed in the second band rejection filter region is near 21 GHz, and the second via hole 166 with a diameter of 0.2 mm is disposed in the middle of the second intermediate conductive film 165. As in the first embodiment, both the centers of the first via hole 164 and the second via hole 166 are on the central line of the pair of transmission line conductors. Here, when a distance Lvia is the distance between the connection pads and the center of the first via hole 164, the distance Lvia is not particularly limited to a specific distance. Here, the distance Lvia is set to 2.5 mm. Further, the distance between the center of the first via hole 164 and the center of the second via hole 166 is set to 4.0 mm.

Figure 24:
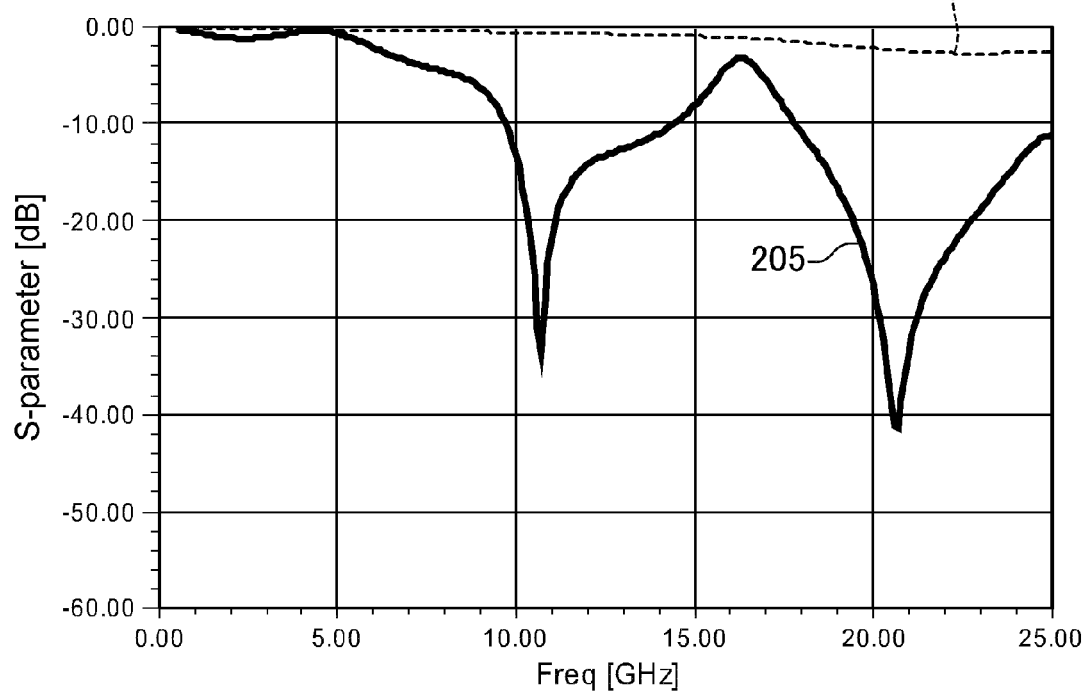
FIG. 24 is a diagram illustrating an analysis result of the differential transmission line according to the seventh embodiment of the invention.

FIG. 24 is a diagram illustrating an analysis result of the differential transmission line 18 according to this embodiment. As in FIG. 5, the analysis result is a result obtained by analyzing the configuration of the differential transmission line 18 by a three-dimensional electromagnetic field structure analysis tool. FIG. 24 shows a frequency dependency of insertion loss in common-mode (Scc21) and insertion loss in differential-mode (Sdd21). In the drawing, the frequency dependencies are shown as a common mode 205 and a differential mode 215. Here, a reference impedance is set to 50Ω for the differential mode and is set to 12.5Ω for the common mode to perform the analysis.

In the differential mode 215, as shown in FIG. 24, good characteristics are obtained in that the loss is small in the frequency region shown in the drawing. On the other hand, in the common mode 205, the deep dip of −33 dB is shown at the frequencies of 10.7 GHz and the deeper dip of −41 dB is shown at the frequency of 20.7 GHz. Thus, the steep characteristics of the band rejection filter circuit can be obtained in the frequency range of 10.7 GHz to 20.7 GHz.

FIG. 28 is a perspective view illustrating the vicinity of the differential transmission line 500 of an information processing system according to a fourth example of the related art which is a comparative example of this embodiment. The differential transmission line 500 shown in FIG. 28 is the same as the differential transmission line 500 according to the second example of the related art in FIG. 26. A shield lid 552 covers the driving integrated circuit 15 and a part of the differential transmission line 500. Here, the shield lid 552 has the same shape as the shield lid 152. Further, the configuration according to the fourth example of the related art is different from the configuration according to this embodiment in that the differential transmission line 500 does not include the band rejection filter region, but the other configuration according to the fourth example of the related art is the same as the configuration according to this embodiment.

The maximum electric field intensities E from the electromagnetic radiation are calculated for the information processing system 100 according to this embodiment and the information processing system according to the fourth example of the related art. The comparison result is shown in Table 3 below.

TABLE 3

| FREQUENCY | FOURTH EXAMPLE OF RELATED ART | SEVENTH EMBODIMENT |
|---|---|---|
| 10.3 GHz | 101 dB (μV/m) | 73 dB (μV/m) |
| 20.6 GHz | 99 dB (μV/m) | 79 dB (μV/m) |

When the maximum electric field intensities E are calculated, the common mode output impedance and the output voltage of the driving integrated circuit 15 obtained using a three-dimensional electromagnetic field structure analysis tool are assumed to be 12.5Ω and 1 V, respectively. When the representative frequencies f are 10.3 GHz corresponding to the bit rate of 10.3 Gbit/s and 20.6 GHz which is the double of the frequency of 10.3 GHz, the maximum electric field intensities E are calculated at an observation position at which a distance D up to an observation point is 3 m. As shown in Table 3, the information processing system 100 according to this embodiment can obtain the advantage of considerably suppressing the maximum electric field intensities E by 28 dB at the frequency of 10.3 GHz and 20 dB at the frequency of 20.6 GHz, compared to the fourth example of the related art.

Accordingly, even in a case where the optical transmitter module 42 which is the open end for the common node operation of the differential input, when the serial data is transmitted at the bit rate of 10 Gbit/s in the information processing system 100 according to this embodiment, conduction propagation of the frequency corresponding to the bit rate and the double frequency component thereof in the differential transmission line is inhibited in spite of the fact that a common mode noise is contained in the differential transmission signal output by the driving integrated circuit 15. Thus, the reduction in the unintentional electromagnetic radiation and signal integrity of the serial data in the optical fiber transmission are compatible.

The differential transmission line according to the invention and the information processing system using the differential transmission line have hitherto been described. The transmitter-side differential transmission line of the information processing system has hitherto been described as an example, but the invention is not, of course, limited thereto. The invention is applicable widely to differential transmission lines that transmit a differential transmission signal output by a driving circuit performing driving at a predetermined bit rate. The information processing system according to the invention is not limited to a communication including a transmission device, but the invention is applicable to a communication module that includes a driving circuit and a differential transmission line.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A differential transmission circuit, in which a differential transmission signal output by a driving circuit performing driving at a predetermined bit rate is transmitted, the circuit comprising:

a grounded conductive layer;
a pair of transmission line conductors which is disposed on one side of the grounded conductive layer via a dielectric layer interposed therebetween;
a conductive film which has a predetermined shape and is disposed between the grounded conductive layer and the pair of transmission line conductors;
a via hole which connects the grounded conductive layer to the conductive film;
a straight-line region in which the pair of transmission line conductors extends parallel to each other so as to have a first width; and
a band rejection filter region in which the pair of transmission line conductors planarly overlaps the conductive film, when viewed from an upper side of the grounded conductive layer, and extends parallel to each other so as to have a second width narrower than the first width and a common mode of the differential transmission signal is attenuated at one of frequencies which are natural number multiples of a frequency corresponding to the predetermined bit rate.

2. The differential transmission circuit according to claim 1, wherein when viewed from the upper side of the grounded conductive layer, a cross-section of the via hole is intersected by a central line of inner edges of the pair of transmission line conductors in the band rejection filter region.

3. The differential transmission circuit according to claim 1, wherein when viewed from the upper side of the grounded conductive layer, a cross-section of the via hole is intersected by a central line of both ends in an extension direction of the band rejection filter region.

4. The differential transmission circuit according to claim 1, wherein when viewed from the upper side of the grounded conductive layer, a cross-section of the via hole includes a point of a distance which is 0.35 times or less a propagation wavelength in the differential transmission circuit of a frequency corresponding to the predetermined bit rate from an output terminal of the driving circuit.

5. The differential transmission circuit according to claim 1,
wherein a central frequency of a band for which the common mode of the differential transmission signal is attenuated is 20 GHz or more, and
wherein when viewed from the upper side of the grounded conductive layer, a cross-section of the via hole includes a point of a distance of 2.8 mm or less from an output terminal of the driving circuit.

6. The differential transmission circuit according to claim 1,
wherein a central frequency of a band for which the common mode of the differential transmission signal is attenuated is 10 GHz or more, and
wherein when viewed from the upper side of the grounded conductive layer, a cross-section of the via hole includes a point of a distance of 5.6 mm or less from an output terminal of the driving circuit.

7. The differential transmission circuit according to claim 1, further comprising:
another conductive film which has a predetermined shape and is disposed between the grounded conductive layer and the pair of transmission line conductors; and
another via hole which connects the grounded conductive layer to the another conductive film,
wherein the differential transmission circuit further comprises another band rejection filter region in which the pair of transmission line conductors planarly overlaps the another conductive film, when viewed from the upper side of the grounded conductive layer, and extends parallel to each other so as to have a third width narrower than the first width and the common mode of the differential transmission signal is attenuated at one of the frequencies which are the natural number multiples of the frequency corresponding to the predetermined bit rate.

8. The differential transmission circuit according to claim 7,
wherein in one of the band rejection filter region and the another band rejection filter region, the common mode of the differential transmission signal is attenuated at the frequency corresponding to the predetermined bit rate, and
wherein in the other of the band rejection filter region and the another band rejection filter region, the common mode of the differential transmission signal is attenuated at a double frequency of the frequency corresponding to the predetermined bit rate.

9. An information processing system comprising:
the differential transmission circuit according to claim 1; and
a driving circuit.

10. The information processing system according to claim 9, further comprising:
an optical modulator in which a differential input terminal is electrically connected to an output side of the differential transmission circuit,
wherein the optical modulator is an open end for a common mode operation of a differential input.

11. The information processing system according to claim 9, further comprising:
an optical transmitter module in which a differential input terminal is electrically connected to an output side of the differential transmission circuit,
wherein the optical transmitter module is an open end for a common mode operation of a differential input.

12. The information processing system according to claim 9, further comprising:
an optical transmitter module in which a single-end input terminal is electrically connected to an output side of one of the transmission line conductors of the differential transmission circuit; and
a termination resistor which is electrically connected to an output side of the other of the transmission line conductors of the differential transmission circuit.

13. The information processing system according to claim 9, further comprising:
a shield lid which covers the driving circuit and a region including the band rejection filter region of the differential transmission circuit.

14. The information processing system according to claim 9,
wherein the differential transmission circuit includes another conductive film which has a predetermined shape and is disposed between the grounded conductive layer and the pair of transmission line conductors, and
another via hole which connects the grounded conductive layer to the another conductive film,
wherein the differential transmission circuit further includes another band rejection filter region in which the pair of transmission line conductors planarly overlaps the another conductive film, when viewed from the upper side of the grounded conductive layer, and extends parallel to each other so as to have a third width narrower than the first width and the common mode of the differential transmission signal is attenuated at one of the frequencies which are the natural number multiples of the frequency corresponding to the predetermined bit rate, and
wherein the information processing system further comprises a shield lid which covers the driving circuit and a region including the band rejection filter region and the another band rejection filter region of the differential transmission circuit.

* * * * *